United States Patent
Huang

(10) Patent No.: US 12,374,382 B2
(45) Date of Patent: Jul. 29, 2025

(54) SIGNAL SAMPLING CIRCUIT AND SEMICONDUCTOR MEMORY

(71) Applicant: CHANGXIN MEMORY TECHNOLOGIES, INC., Hefei (CN)

(72) Inventor: Zequn Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 307 days.

(21) Appl. No.: 17/954,664

(22) Filed: Sep. 28, 2022

(65) Prior Publication Data

US 2023/0017682 A1 Jan. 19, 2023

Related U.S. Application Data

(63) Continuation of application No. PCT/CN2022/091111, filed on May 6, 2022.

(30) Foreign Application Priority Data

Mar. 23, 2022 (CN) .......................... 202210295379.8

(51) Int. Cl.
*G11C 11/00* (2006.01)
*G11C 7/06* (2006.01)
*G11C 7/22* (2006.01)
*G11C 11/4076* (2006.01)
*H03K 3/037* (2006.01)
*H03K 19/20* (2006.01)

(52) U.S. Cl.
CPC ............ *G11C 11/4076* (2013.01); *G11C 7/06* (2013.01); *G11C 7/222* (2013.01); *G11C 7/225* (2013.01); *H03K 3/037* (2013.01); *H03K 19/20* (2013.01)

(58) Field of Classification Search
CPC ... G11C 11/4076; G11C 7/1087; G11C 7/109; G11C 7/1093; G11C 11/4093; H03K 3/037; H03K 19/20
USPC .......................................................... 365/156
See application file for complete search history.

(56) References Cited

U.S. PATENT DOCUMENTS

| 7,681,062 B2 * | 3/2010 | Kuroki | G06F 1/06 713/400 |
| 10,679,683 B1 | 6/2020 | Chen | |
| 2014/0181567 A1 * | 6/2014 | Choi | G11C 7/225 713/400 |

* cited by examiner

*Primary Examiner* — Tha-O H Bui
(74) *Attorney, Agent, or Firm* — Syncoda LLC; Feng Ma

(57) ABSTRACT

A signal sampling circuit includes: a signal input circuit, configured to determine a to-be-processed command signal and a to-be-processed chip select signal; a clock receiving circuit, configured to receive an initial clock signal and perform frequency division processing on the initial clock signal to obtain a first clock signal; a sampling and logic circuit, configured to perform two-stage sampling processing and logic operation processing on the to-be-processed chip select signal according to the first clock signal to obtain a chip select clock signal, where the chip select clock signal includes two pulses, and the width of each pulse is a preset clock cycle; and a decoding circuit, configured to perform decoding processing and sampling processing on the to-be-processed command signal according to the to-be-processed chip select signal and the chip select clock signal to obtain a target command signal.

20 Claims, 12 Drawing Sheets

SIGNAL SAMPLING CIRCUIT AND SEMICONDUCTOR MEMORY

CROSS-REFERENCE TO RELATED APPLICATIONS

This application is a continuation of International Application No. PCT/CN2022/091111, filed on May 6, 2022, which claims priority to Chinese Patent Application No. 202210295379.8, filed on Mar. 23, 2022. The disclosures of International Application No. PCT/CN2022/091111 and Chinese Patent Application No. 202210295379.8 are hereby incorporated by reference in their entireties.

BACKGROUND

With the continuous development of semiconductor technology, people have put forward higher requirements for the transmission speed of data in the manufacture and use of devices such as computers. In order to obtain higher data transmission speed, a series of devices such as memories that can transmit data at Double Data Rate (DDR) have emerged.

In a Dynamic Random Access Memory (DRAM), an input command/address signal can be sampled as an address or sampled and decoded as a command. When the input command/address signal is used as a command, it is necessary to perform sampling and decoding to obtain a decoded signal. However, the uncertainty in the pulse width of the decoded signal may lead to data failure and affect the performance of a semiconductor.

SUMMARY

The disclosure relates to the technical field of integrated circuits, and in particular, to a signal sampling circuit and a semiconductor memory.

The disclosure provides a signal sampling circuit and a semiconductor memory, which can mitigate the problem of uncertainty in signal pulse width and improve the quality of a target command signal.

In a first aspect, embodiments of the disclosure provide a signal sampling circuit. The signal sampling circuit includes a signal input circuit, a clock receiving circuit, a sampling and logic circuit, and a decoding circuit. The signal input circuit is configured to determine a to-be-processed command signal and a to-be-processed chip select signal. The clock receiving circuit is configured to receive an initial clock signal and perform frequency division processing on the initial clock signal to obtain a first clock signal, where a clock cycle of the initial clock signal is a preset clock cycle, and a clock cycle of the first clock signal is twice the length of the preset clock cycle. The sampling and logic circuit is configured to perform two-stage sampling processing and logic operation processing on the to-be-processed chip select signal according to the first clock signal to obtain a chip select clock signal, where the chip select clock signal includes two pulses, and the width of each pulse is a preset clock cycle. The decoding circuit is configured to perform decoding processing and sampling processing on the to-be-processed command signal according to the to-be-processed chip select signal and the chip select clock signal to obtain a target command signal.

In a second aspect, embodiments of the disclosure provide a semiconductor memory, including the signal sampling circuit according to the first aspect.

DETAILED DESCRIPTION

Figure 1:
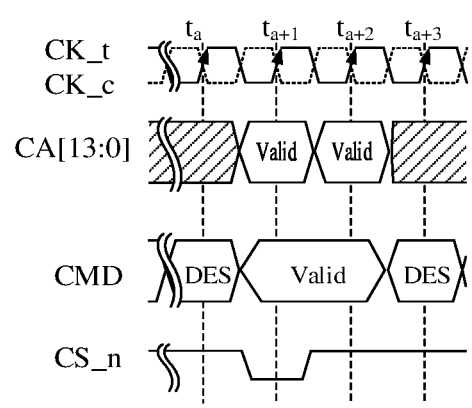
FIG. 1 is a schematic diagram of the signal time series of two clock cycle commands.

The following describes the technical solutions in embodiments of the disclosure clearly and completely with reference to the drawings in the embodiments of the disclosure. It can be understood that the specific embodiments described herein are merely used to explain the relevant application, and are not intended to limit the application. In addition, it should be noted that, for the convenience of description, only the parts related to the relevant application are shown in the drawings.

Unless otherwise specified, all technical and scientific terms used herein have the same meanings as commonly understood by those skilled in the technical field that the disclosure relates to. The terms used herein are for the purpose of describing the embodiments of the disclosure only, and are not intended to limit the disclosure.

In the following description, the term "some embodiments" describes subsets of all possible embodiments, but it should be understood that "some embodiments" may be the same subset or different subsets of all the possible embodiments, and can be combined with each other as long as they are not contradictory to each other.

It should be pointed out that the terms "first\second\third" involved in the embodiments of the disclosure are only used to distinguish similar objects, and do not represent a specific ordering of objects. Additionally, it can be understood that "first\second\third" may be interchanged in a specific order or sequence as conditions permit to enable the embodiments of the disclosure described herein to be implemented in sequences other than those illustrated or described herein.

The following are the explanations of the technical terms involved in the embodiments of the disclosure and corresponding relationships of some terms:

Dynamic Random Access Memory (DRAM)
Synchronous Dynamic Random Access Memory (SDRAM)
Double Data Rate (DDR)
5th DDR (DDR5)
Command/Address (CMD/ADD or CA) Input
Clock Input (CLK)
Chip Select Input (CS)
Buffer/Repeater (RPT)
Command Decoder (CMD DEC)
Data Flip-Flop or Delay Flip-Flop (DFF)
Process, Voltage, Temperature (PVT)

It can be understood that, taking the design of a DDR5 DRAM as an example, the CA input can be sampled as an address and can be sampled and decoded as a command. The CA here is the general name of various command/address signals of a DRAM, which may include a Row Address Strobe (RAS), a Column Address Strobe (CAS), a Write (WE) command, and an Active (ACT) command, and may also include address signals of A13-A0, etc. In addition, in practical applications, the number of address signals included in the command/address signal can be specifically determined according to the specifications of the DRAM, and is not limited in the embodiments of the disclosure.

For a two-clock-cycle command signal (represented by 2T CMD) in the DDR5 DRAM, FIG. 1 illustrates a schematic diagram of the signal time series of a two-clock-cycle command. In FIG. 1, CK_t and CK_c are a pair of complementary clock signals, CA[13:0] is the CA input, CMD is the command signal obtained after CA decoding, and CS_n is the chip select signal indicating that the CA is active. As shown in FIG. 1, CA[13:0] is a signal that lasts for two clock cycles, CA[13:0] in the first clock cycle and CA[13:0] in the second clock cycle need to be sampled as address signals. In DDR5, CA[4:0] in the first clock cycle further needs to be sampled and decoded as a command signal. In addition, the clock cycle refers to the clock cycle of CK_t/CK_c.

The embodiments of the disclosure mainly describe the part in which CA is sampled and decoded as a command signal, and the part in which CA is sampled and output as an address signal is omitted and will not be described herein.

Figure 2:
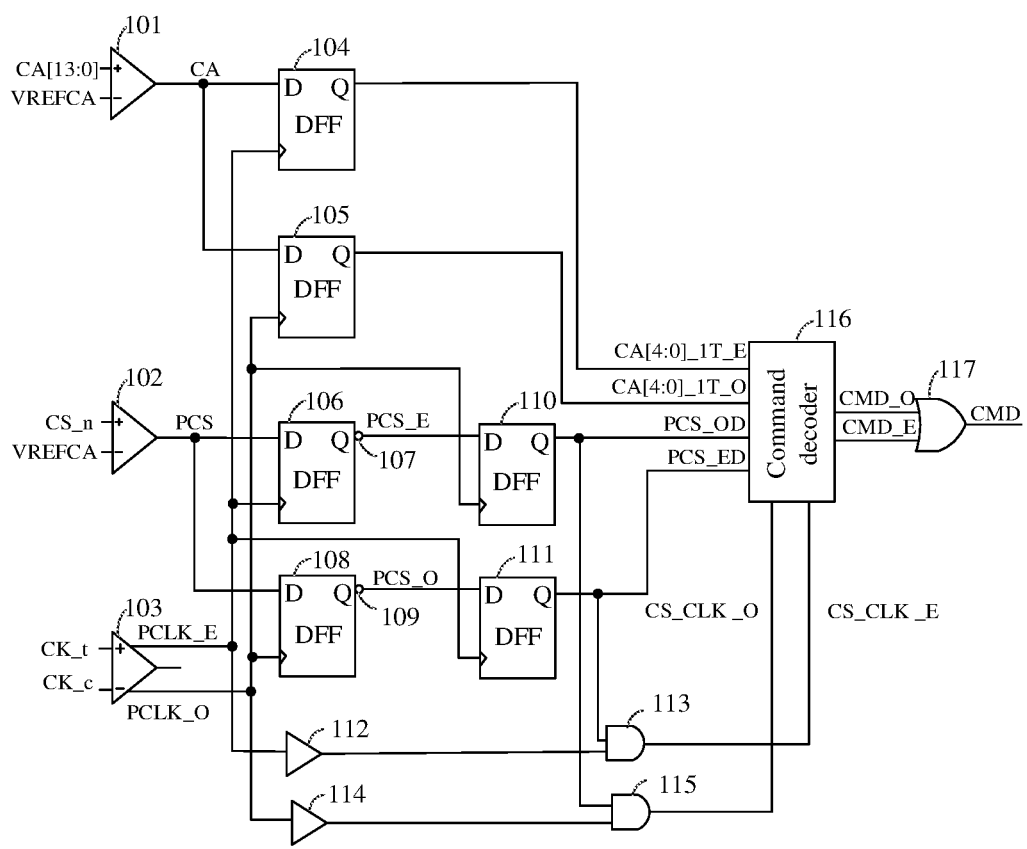
FIG. 2 is a schematic structural diagram of a signal sampling circuit.
Figure 3:
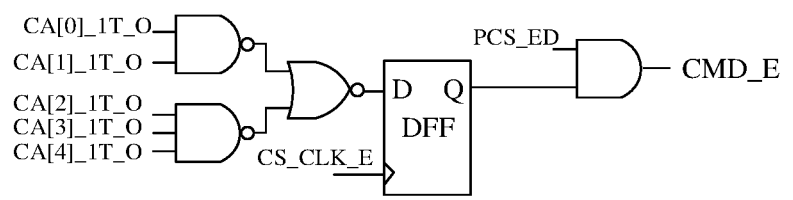
FIG. 3 is a schematic structural diagram of a command decoder.
Figure 3:
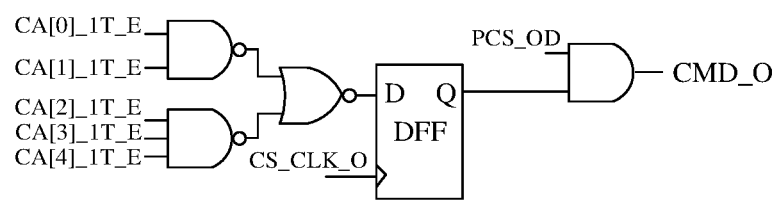

For example, FIG. 2 illustrates a schematic structural diagram of a signal sampling circuit. As shown in FIG. 2, the signal sampling circuit includes a first receiver 101, a second receiver 102, a third receiver 103, a first flip-flop 104, a second flip-flop 105, a third flip-flop 106, a first inverter 107, a fourth flip-flop 108, a second inverter 109, a fifth flip-flop 110, a sixth flip-flop 111, a first buffer 112, a first AND gate 113, a second buffer 114, a second AND gate 115, a command decoder 116, and an OR gate 117. The first flip-flop 104, the second flip-flop 105, the third flip-flop 106, the fourth flip-flop 108, the fifth flip-flop 110, and the sixth flip-flop 111 may all be DFFs. The command decoder 116 may be composed of logic components such as a three-input NAND gate, a two-input NOR gate, and a buffer, as shown in FIG. 3 for details.

In FIG. 2, input signals of the first receiver 101 are an initial command/address signal (represented by CA[13:0]) and a reference signal (represented by VREFCA), and an output signal is an intermediate command/address signal (represented by CA). Input signals of the second receiver 102 are an initial chip select signal (represented by CS_n) and a reference signal (represented by VREFCA), and an output signal is an intermediate chip select signal (represented by PCS). An input signal of the third receiver 103 is an initial clock signal (including a CK_t signal and a CK_c signal), and a clock even signal (represented by PCLK_E) and a clock odd signal (represented by PCLK_O) are obtained after frequency division processing. Here, CK_t/CK_c is a pair of complementary signals with a phase difference of 180°, and the clock cycle of CK_t/CK_c is a preset clock cycle. The clock cycle of PCLK_E/PCLK_O is twice the length of the preset clock cycle, and the phase difference is 180°. It should be noted that CA[13:0] here represents a group of signals, which is a combined term of CA[0], CA[1], . . . , CA[13]. Correspondingly, the first receiver 101 actually includes 14 receiving circuits, and output lines. Even the number of following sampling circuits included is 14, and these sampling circuits are in one-to-one correspondence with CA[0], CA[1], . . . , and CA[13].

Then, in CA[13:0], the CA[0], CA[1], CA[2], CA[3], and CA[4] are used for decoding to form a command signal, represented by CA[4:0]. Therefore, first-stage sampling processing is performed on the intermediate command/address signal CA by the first flip-flop 104 using the clock odd signal PCLK_O to obtain a to-be-processed command odd signal (represented by CA[4:0]_1T_O), and first-stage sampling processing is performed on the intermediate command/address signal CA by the second flip-flop 105 using the clock even signal PCLK_E to obtain a to-be-processed command even signal (represented by CA[4:0]_1T_E). Here, the intermediate command/address signal CA will actually be sampled and output as address signals, but this part of the circuit is not involved in the embodiments of the disclosure, and thus has been omitted and will not be described here.

In addition, the intermediate chip select signal PCS is sampled and inverted by the clock even signal PCLK_E by the third flip-flop 106 and the first inverter 107 to obtain a to-be-processed chip select signal (represented by PCS_E), and the to-be-processed chip select even signal PCS_E is sampled by the fifth flip-flop 110 using the clock odd signal PCLK_O to obtain a first chip select sampling odd signal (represented by PCS_OD). Similarly, the intermediate chip select signal PCS is sampled and inverted by the fourth flip-flop 108 and the second inverter 109 using the clock odd signal PCLK_O to obtain a to-be-processed chip select odd signal (represented by PCS_O), and the to-be-processed chip select odd signal PCS_O is sampled using the clock even signal PCLK_E to obtain a first chip select sampling even signal (represented by PCS_ED).

Here, because the initial chip select signal CS_n is an active-low pulse signal, if the intermediate chip select signal PCS is at a low level on a rising edge of an even clock cycle, the to-be-processed chip select even signal PCS_E and the first chip select sampling odd signal PCS_OD are active; and if the initial chip select signal CS_n is at a low level at a rising edge of an odd clock cycle, the to-be-processed chip select odd signal PCS_O and the first chip select sampling odd signal PCS_ED are active. Here, the even clock cycle or the odd clock cycle refers to the clock cycle of the initial clock signal CK_t/CK_c. Specifically, after frequency division processing of the third receiver 103, a clock odd signal PCLK_E and a clock even signal PCLK_O can be obtained. Then, the clock cycle at which the rising edge of the clock even signal PCLK_E is located is regarded as an even clock cycle, and the clock cycle at which the rising edge of the clock odd signal PCLK_O is located is regarded as an odd clock cycle.

In addition, after passing through the first buffer 112, the clock even signal PCLK_E is input to the first AND gate 113 along with a first chip select sampling even signal PCS_ED, so as to obtain a chip select clock even signal (represented by CS_CLK_E) by operation. After passing through the second buffer 114, the clock odd signal PCLK_O is input to the second AND gate 115 along with a first chip select sampling odd signal PCS_OD, so as to obtain a chip select clock odd signal (represented by CS_CLK_O) by operation. In particular, since only one of the first chip select sampling even signal PCS_ED and the first chip select sampling odd signal PCS_OD is active, only one of the chip select clock odd signal CS_CLK_O and the chip select clock even signal CS_CLK_E is active.

Then, the to-be-processed command even signal CA[4:0]_1T_E/the to-be-processed command odd signal CA[4:0]_1T_O and the first chip select sampling odd signal PCS_OD/the first chip select sampling even signal PCS_ED are decoded and sampled by the command decoder 116 using the chip select clock odd signal CS_CLK_O/chip select clock even signal CS_CLK_E to obtain a command even signal (represented by CMD_E) and a command odd signal (represented by CMD_O). Finally, the OR gate 117 performs OR logic operation on the command even signal CMD_E and the command odd signal CMD_O to obtain a target command signal (represented by CMD), so that the target command signal CMD enters the subsequent module for the next application.

Figure 4:
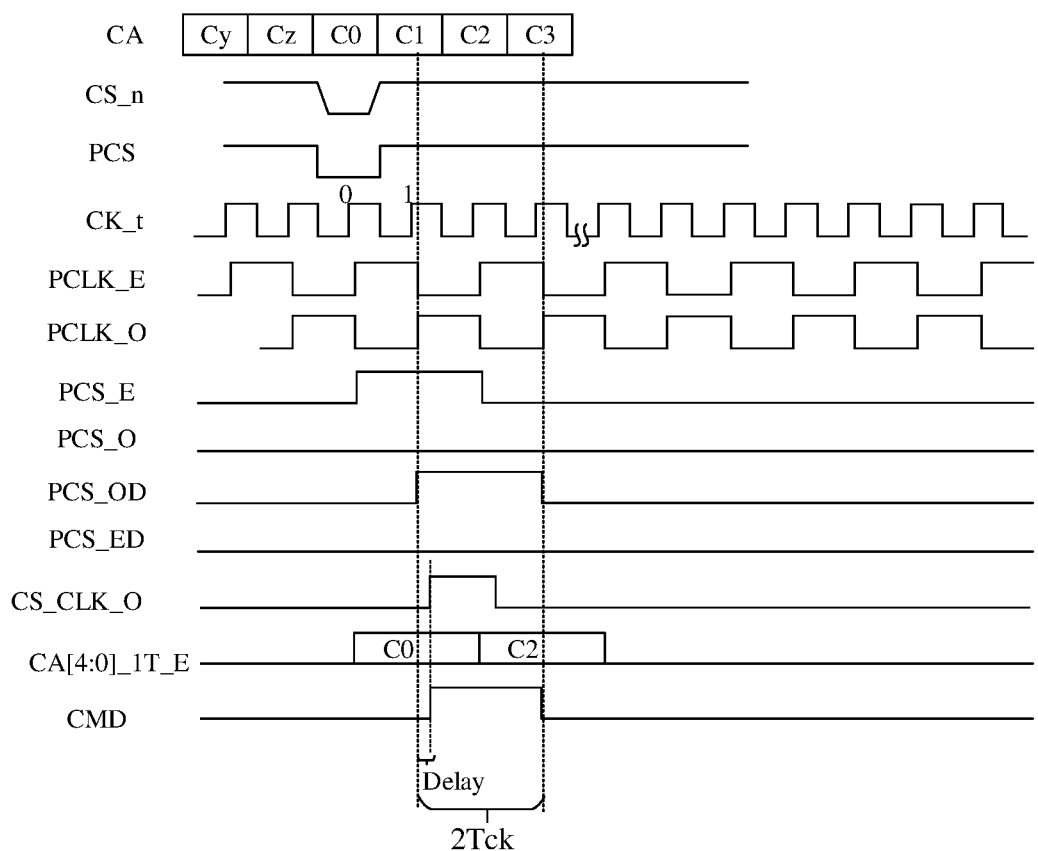
FIG. 4 is a schematic diagram of the signal time series of a signal sampling circuit.

On the basis of the signal sampling circuit shown in FIG. 2 and FIG. 3, the corresponding signal time series diagram is shown in FIG. 4. In FIG. 4, the initial clock signal is represented by CK_t/CK_c, the clock even signal is represented by PCLK_E, the clock odd signal is represented by PCLK_O, the clock cycle of CK_t/CK_c is the preset clock cycle, and the clock cycle of PCLK_E/PCLK_O is twice the length of the preset clock cycle. The intermediate command/address signal is represented by CA, and CA may include Cy, Cz, C0, C1, C2, and C3. The initial chip select signal is represented by CS_n, the intermediate chip select signal is represented by PCS, and PCS is an active-low pulse signal. PCS is used for representing the signal indicating that a target chip is selected. Please refer to FIG. 2 for the meaning and origin of other signals.

As shown in FIG. 4, firstly, first-stage sampling is performed on the intermediate command/address signal CA containing C0 and C2 and the low-level intermediate chip select signal PCS by the clock even signal PCLK_E to generate a to-be-processed command even signal CA[4:0]_1T_E and an active to-be-processed chip select even signal PCS_E; next, second-stage sampling is performed on the to-be-processed chip select even signal PCS_E by the clock odd signal PCLK_O to obtain a first chip select sampling odd signal PCS_OD, and operation is carried out on the first chip select sampling odd signal PCS_OD and the clock odd signal PCLK_O to obtain an active chip select clock odd signal CS_CLK_O. Then, the to-be-processed command even signal CA[4:0]_1T_E is decoded and sampled using the active first chip select sampling odd signal PCS_OD and the active chip select clock odd signal CS_CLK_O to obtain a target command signal. Similarly, first-stage sampling is performed on the intermediate command/address signal CA containing C1 and C3 and the high-level intermediate chip select signal PCS by the clock odd signal PCLK_O to generate CA[4:0]_1T_O (not shown) and an inactive intermediate chip select odd signal PCS_O. Second-stage sampling is performed on the intermediate chip select odd signal PCS_O by the clock even signal PCLK_E to generate an inactive first chip select sampling even signal PCS_ED, and operation is carried out on the first chip select sampling even signal PCS_ED and the clock even signal PCLK_E to obtain an inactive chip select clock even signal CS_CLK_E. Then, the to-be-processed command odd signal CA[4:0]_1T_O is decoded and sampled using the inactive first chip select sampling even signal PCS_ED and the inactive chip select clock even signal CS_CLK_E, and no active signal is obtained.

In this way, the clock odd signal PCLK_O/clock even signal PCLK_E are masked by the first chip select sampling odd signal PCS_OD/the first chip select sampling even signal PCS_ED, such that for the chip select clock odd signal CS_CLK_O/chip select clock even signal CS_CLK_E, only one active signal will be retained. The active signal in the chip select clock odd signal CS_CLK_O/chip select clock even signal CS_CLK_E includes a pulse, and the pulse width of the pulse is a preset clock cycle. Here, the preset clock cycle refers to the clock cycle of the initial clock signal CK_t/CK_c.

That is to say, in this scenario, the chip select clock odd signal CS_CLK_O includes a pulse, and the pulse width is a preset clock cycle. The first chip select sampling odd signal PCS_OD includes a pulse, and the pulse width is twice the length of the preset clock cycle. The chip select clock odd signal CS_CLK_O is used for generating the rising edge of CMD, and the first chip select sampling odd signal PCS_OD is used for generating the falling edge of CMD. However, as shown in FIG. 2, the chip select clock odd signal CS_CLK_O is obtained by AND operation of the first chip select sampling odd signal PCS_OD and the clock odd signal PCLK_O. Therefore, there is a delay between the rising edge of the chip select clock odd signal CS_CLK_O and the rising edge of the first chip select sampling odd signal PCS_OD. As shown in FIG. 3, although the first chip select sampling odd signal PCS_OD signal will last for two preset clock cycles, due to the delay between the rising edge of the chip select clock odd signal CS_CLK_O and the rising edge of the first chip select sampling odd signal PCS_OD, the pulse width of the target command signal CMD is not twice the length of the preset clock cycle, but equals to the difference between twice the length of the preset clock cycle and the delay. The delay refers to the delay between the rising edge of the chip select clock odd signal CS_CLK_O and the rising edge of the first chip select sampling odd signal PCS_OD. That is, the pulse width of the target command signal CMD equals to (2Tck-delay), which leads to an error caused by the failure of the target command signal CMD due to a small pulse width in a high frequency state or a change in PVT. Here, 2Tck represents twice the length of the preset clock cycle.

To put it simply, in the above scenario, the first chip select sampling even signal PCS_ED/the first chip select sampling odd signal PCS_OD are used for masking the clock odd signal PCLK_O/clock even signal PCLK_E, such that only one active signal is retained between the chip select clock odd signal CS_CLK_O/chip select clock even signal CS_CLK_E, and the pulse width is a preset clock cycle (as shown in FIG. 4, the chip select clock odd signal CS_CLK_O). However, when the active signal in the chip select clock odd signal CS_CLK_O/chip select clock even signal CS_CLK_E is sampling a command of the to-be-processed command odd signal CA[4:0]_1T_O/the to-be-processed command even signal CA[4:0]_1T_E after combinational logic, a target command signal CMD without a falling edge will be generated, and then it is necessary to perform AND logic operation on the target command signal CMD along with the active signal in the first chip select sampling odd signal PCS_OD/first chip select sampling even signal PCS_ED to generate the falling edge of the target command signal CMD, so that the pulse width of the target command signal CMD may be twice the length of the preset clock cycle as expected. However, due to the logic circuit delay between the rising edge of the first chip select sampling odd signal PCS_OD and the rising edge of the chip select clock odd signal CS_CLK_O, the pulse width of the final generated target command signal CMD will be 2Tck-delay, which leads to an error caused by a failure due to uncertainty in the pulse width of the target command signal CMD in the case of a high frequency and a change in PVT.

On this basis, the embodiments of the disclosure provide a signal sampling circuit. The signal sampling circuit includes a signal input circuit, a clock receiving circuit, a sampling and logic circuit, and a decoding circuit, where the signal input circuit is configured to determine a to-be-processed command signal and a to-be-processed chip select signal; the clock receiving circuit is configured to receive an initial clock signal and perform frequency division processing on the initial clock signal to obtain a first clock signal, where a clock cycle of the initial clock signal is a preset clock cycle, and a clock cycle of the first clock signal is twice the length of the preset clock cycle; the sampling and logic circuit is configured to perform two-stage sampling processing and logic operation processing on the to-be-processed chip select signal according to the first clock signal to obtain a chip select clock signal, where the chip select clock signal includes two pulses, and the width of each pulse is a preset clock cycle; and the decoding circuit is configured to perform decoding processing and sampling processing on the to-be-processed command signal according to the to-be-processed chip select signal and the chip select clock signal to obtain a target command signal. In this way, after processing by the signal sampling circuit, the chip select clock signal includes two pulses, and the width of each pulse is a preset clock cycle, such that the pulse width of the target command signal after decoding and sampling will not deviate with changes in process, voltage, temperature, etc., thereby mitigating the problem of uncertainty in the pulse width of the target command signal, improving signal quality, and preventing data failure.

The following describes the embodiments of the disclosure in detail with reference to the drawings.

Figure 5:
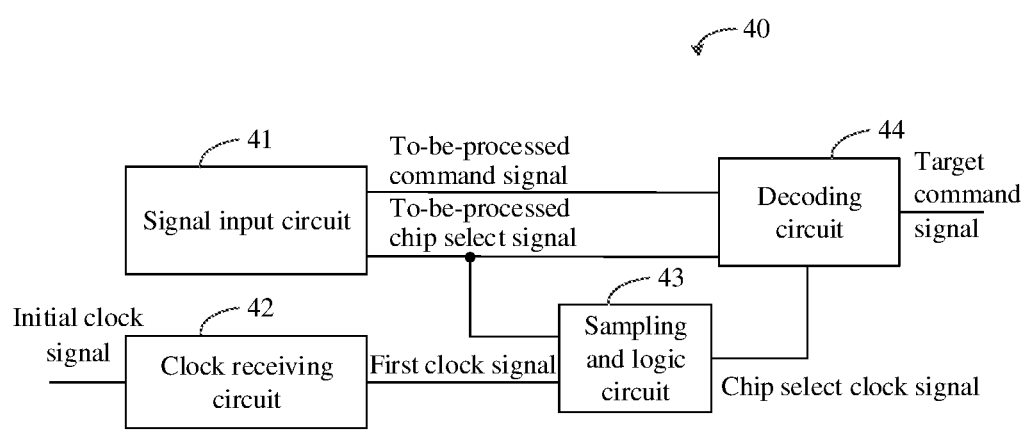
FIG. 5 is a schematic structural diagram of a signal sampling circuit according to an embodiment of the disclosure.

In an embodiment of the disclosure, FIG. 5 illustrates a schematic structural diagram of a signal sampling circuit 40 according to the embodiment of the disclosure. As shown in FIG. 5, the signal sampling circuit 40 includes a signal input circuit 41, a clock receiving circuit 42, a sampling and logic circuit 43, and a decoding circuit 44.

The signal input circuit 41 is configured to determine a to-be-processed command signal and a to-be-processed chip select signal.

The clock receiving circuit 42 is configured to receive an initial clock signal and perform frequency division processing on the initial clock signal to obtain a first clock signal, where a clock cycle of the initial clock signal is a preset clock cycle, and a clock cycle of the first clock signal is twice the length of the preset clock cycle.

The sampling and logic circuit 43 is configured to perform two-stage sampling processing and logic operation processing on the to-be-processed chip select signal according to the first clock signal to obtain a chip select clock signal, where the chip select clock signal includes two pulses, and the width of each pulse is a preset clock cycle.

The decoding circuit 44 is configured to perform decoding processing and sampling processing on the to-be-processed command signal according to the to-be-processed chip select signal and the chip select clock signal to obtain a target command signal.

It should be noted that the signal sampling circuit 40 in the embodiment of the disclosure can be applied to various circuit scenarios, and the following explanation and description will be given by taking a command decoding process of a command/address signal in a DRAM as an example, but this does not constitute a relevant limitation.

Therefore, the to-be-processed command signal may be determined according to the command/address signal in the DRAM. The to-be-processed chip select signal is used for indicating whether a memory chip is selected. The to-be-processed command signal is active only when the memory chip is selected. Therefore, the to-be-processed chip select signal is also a signal used for indicating whether the to-be-processed command signal is active. The target command signal is a command signal obtained by decoding the to-be-processed command signal.

That is to say, when the to-be-processed chip select signal is active, the to-be-processed command signal needs to be decoded to obtain the target command signal.

It should be noted that, the signal sampling circuit 40 provided by the embodiment of the disclosure can be applied to a two-preset-clock-cycle command signal (represented by 2T CMD). The following is a brief description of the 2T CMD scenario. As shown in FIG. 1, in a 2T CMD mode, there are command/address signal CA[13:0] and a chip select signal CS_n, and the command/address signal includes an active signal having two preset clock cycles, and accordingly, the target command signal CMD includes an active command having two preset clock cycles. It should be understood that in each clock cycle, the command/address signal is composed of multiple signals, that is, the command/address signal is not one single signal, but is composed of a group of signals. For example, the command/address signal may be composed of 14 signals, i.e., CA[0], CA[1], ..., and CA[13], and is represented by CA[13:0]. In addition, the chip select signal CS_n is a signal used for indicating that the memory chip is selected, and the pulse width is a preset clock cycle. The chip select signal CS_n is an active-low pulse signal. The command/address signal CA[13:0] corresponding to the clock cycle and the next clock cycle of the clock cycle is active. Specifically, CA[13:0] in the first clock cycle and CA[13:0] in the second clock cycle need to be sampled as address signals, and CA[4:0] in the first clock cycle also needs to be sampled and decoded as a command signal. Here, CA[4:0] refers to CA[0], CA[1], CA[2], CA[3], and CA[4].

In the above scenario, the signal sampling circuit 40 can be used for the sampling and decoding process of the command/address signal as a command signal. Specifically, by the signal input circuit 41, the to-be-processed command signal is determined according to the command/address signal CA[13:0] in the first clock cycle, and the to-be-processed chip select signal is determined according to the chip select signal CS_n. Next, frequency division processing is performed on the initial clock signal by the clock receiving circuit 42 to obtain a first clock signal. Then, two-stage sampling and logic operation processing are performed on the to-be-processed chip select signal by the sampling and logic circuit 43 using the first clock signal to obtain a chip select clock signal, so that the chip select clock signal includes two pulses, and the width of each pulse is a preset clock cycle. Finally, the to-be-processed chip select signal and the to-be-processed command signal are decoded together, and the chip select clock signal is used as a clock signal to sample and output the decoded signal to obtain a target command signal.

Specifically, in some embodiments, the target command signal includes a pulse, and a width of the pulse is twice the length of the preset clock cycle. The rising edge of a first pulse in the chip select clock signal is used for generating the rising edge of the target command signal, and a rising edge of a second pulse in the chip select clock signal is used for generating the falling edge of the target command signal.

It should be noted that the rising edge indicates that the signal changes from a low-level state to a high-level state, and the falling edge indicates that the signal changes from a high-level state to a low-level state.

In this way, since the rising edge of the first pulse of the chip select clock signal is used for generating the rising edge of the target command signal, and the rising edge of the second pulse of the chip select clock signal is used for generating the falling edge of the target command signal, the pulse width of the target command signal is twice the length of the preset clock cycle, such that the problem that the pulse width of the target command signal is uncertain can be prevented, thereby preventing data failure in a high-frequency environment or when the PVT changes. In particular, "the pulse width of the target command signal is twice the length of the preset clock cycle" in the embodiment of the disclosure means that the deviation between the pulse width of the target command signal and twice the length of the preset clock cycle is within a preset accuracy range, and other descriptions related to the signal pulse width can also be understood with reference to this.

In some embodiments, the first clock signal includes a clock odd signal and a clock even signal. The clock cycles of the clock odd signal and the clock even signal are both twice the length of the preset clock cycle, and the phase difference between the clock odd signal and the clock even signal is 180 degrees.

Figure 6:
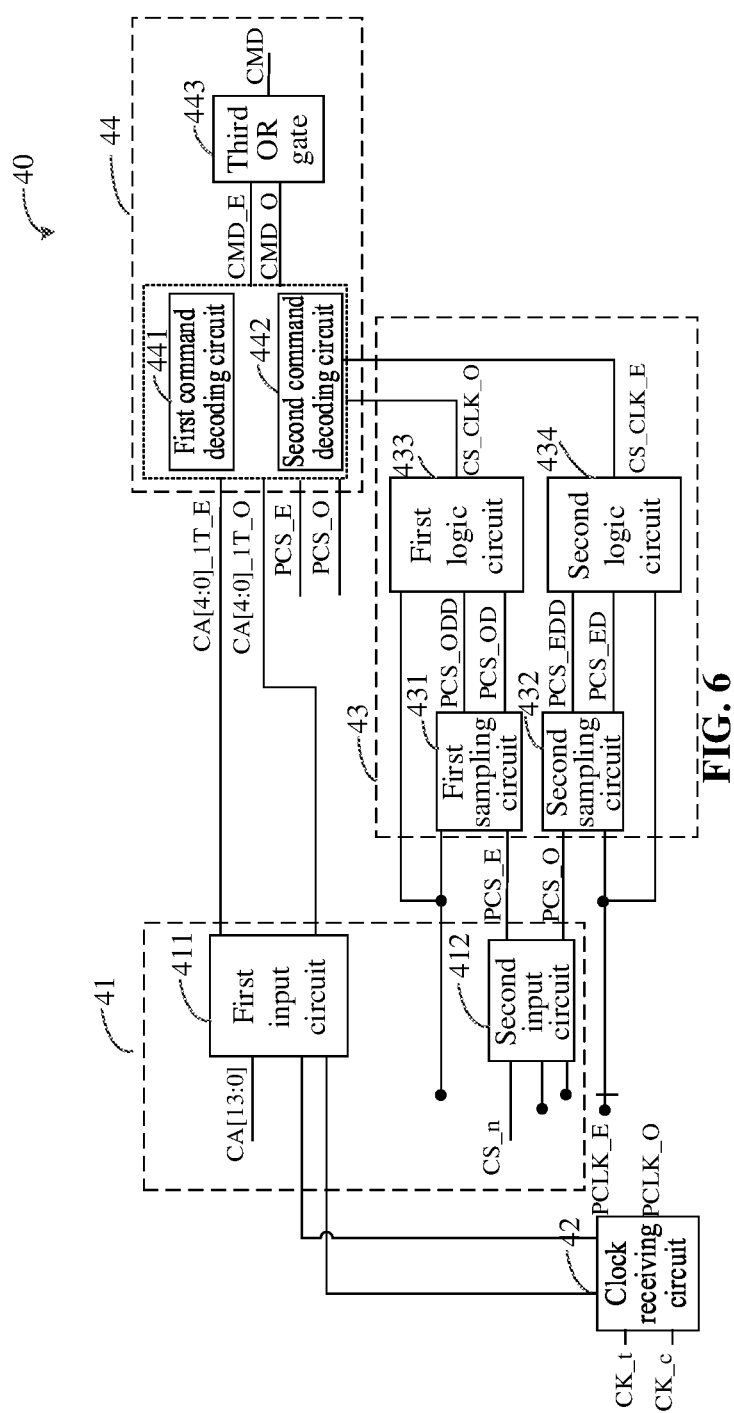
FIG. 6 is a schematic structural diagram of another signal sampling circuit according to an embodiment of the disclosure.

In some embodiments, on the basis of the signal sampling circuit 40 shown in FIG. 5, as shown in FIG. 6, the signal input circuit 41 includes a first input circuit 411 and a second input circuit 412.

The first input circuit 411 is configured to receive an initial command signal and output an intermediate command signal, and to sample the intermediate command signal using the clock odd signal to obtain a to-be-processed command odd signal and sample the intermediate command signal using the clock even signal to obtain a to-be-processed command even signal.

The second input circuit 422 is configured to receive an initial chip select signal and output an intermediate chip select signal, and to perform sampling processing and inversion processing on the intermediate chip select signal using the clock odd signal to obtain a to-be-processed chip select odd signal and perform sampling processing and inversion processing on the intermediate chip select signal using the clock even signal to obtain a to-be-processed chip select even signal.

Here, the to-be-processed command odd signal and the to-be-processed command even signal constitute the to-be-processed command signal, and the to-be-processed chip select odd signal and the to-be-processed chip select even signal constitute the to-be-processed chip select signal.

In FIG. 6, the initial clock signal here is represented by CK_t/CK_c, the clock odd signal is represented by PCLK_O, the clock even signal is represented by PCLK_E, the initial command signal is represented by CA[13:0], the to-be-processed command odd signal is represented by CA[4:0]_1T_O, the to-be-processed command even signal is represented by CA[4:0]_1T_E, the initial chip select signal is represented by CS_n, the to-be-processed chip select odd signal is represented by PCS_O, and the to-be-processed chip select even signal is represented by PCS_E.

It should be noted that an initial command signal and an intermediate command signal are not single signals, but each represents a group of command/address signals, i.e., CA[0] to CA[13], and is represented by CA[13:0]. Therefore, for the first input circuit 411, 14 identical structures can be included here and configured to receive and sample 14 signals such as CA[0], CA[1], . . . , and CA[13]. Only one structure is shown in this figure for illustration.

The first five signals of CA[13:0] are sampled as CA[4:0]_1T. That is to say, CA[4:0]_1T_E is not one single signal, but represents a group of command/address signals, i.e., CA[0]_1T_E to CA[4]_1T_E, and CA[4:0]_1T_O is not one single signal, but represents a group of command/address signals, i.e., CA[0]_1T_O to CA[4]_1T_O.

The initial chip select signal CS_n may be received and sampled by the second input circuit 412 to obtain a to-be-processed chip select odd signal PCS_O and a to-be-processed chip select even signal PCS_E, respectively. The initial chip select signal CS_n is an active-low pulse signal. If the initial chip select signal CS_n is at a low level at a rising edge of an odd clock cycle, the to-be-processed chip select odd signal PCS_O is active, and the to-be-processed chip select even signal PCS_E is inactive. If the initial chip select signal CS_n is at a low level at a rising edge of an even clock cycle, the to-be-processed chip select even signal PCS_E is active, and the to-be-processed chip select odd signal PCS_O is inactive. That is to say, there is at most one active signal in the to-be-processed chip select odd signal PCS_O and the to-be-processed chip select even signal PCS_E.

Here, the even clock cycle or the odd clock cycle refers to the clock cycle of the initial clock signal CK_t/CK_c. Specifically, after the initial clock signal is subject to frequency division processing, a clock odd signal PCLK_E and a clock even signal PCLK_O can be obtained. Then, the clock cycle at which the rising edge of the clock even signal PCLK_E is located is regarded as an even clock cycle, and the clock cycle at which the rising edge of the clock odd signal PCLK_O is located is regarded as an odd clock cycle.

Figure 7:
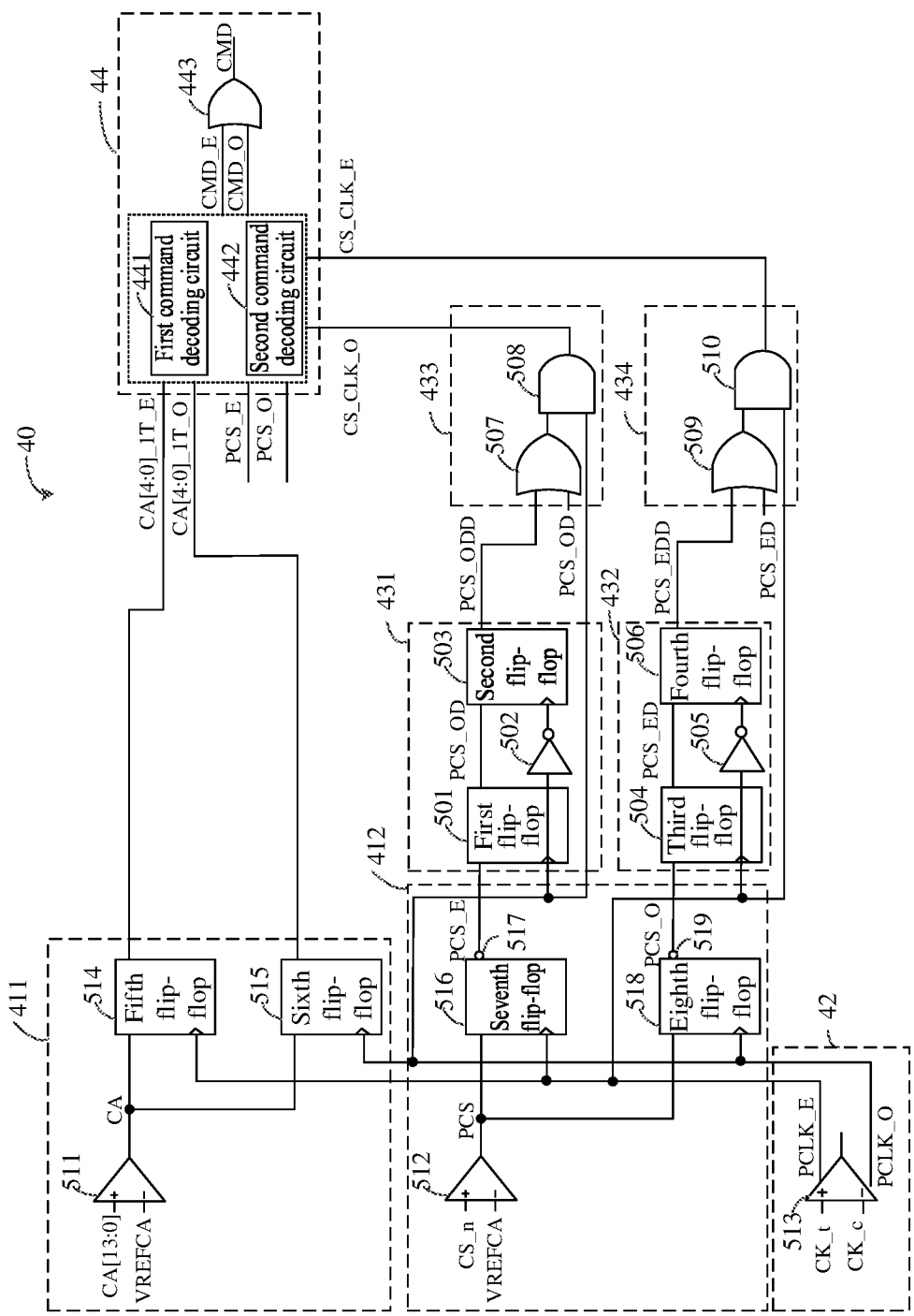
FIG. 7 is a schematic structural diagram of another signal sampling circuit according to an embodiment of the disclosure.

In a specific embodiment, on the basis of FIG. 6, with reference to FIG. 7, the first input circuit 411 may include a first receiver 511, a fifth flip-flop 514, and a sixth flip-flop 515. The input terminal of the first receiver 511 is configured to receive an initial command signal CA[13:0] and a reference voltage signal VREFCA, and the output terminal of the first receiver 511 is configured to output an intermediate command signal (represented by CA). The input terminal of the fifth flip-flop 514 is connected to the output terminal of the first receiver 511, and the clock terminal of the fifth flip-flop 514 is connected to a clock even signal PCLK_E. The output terminal of the fifth flip-flop 514 is configured to output a to-be-processed command even signal CA[4:0]_1T_E. The input terminal of the sixth flip-flop 515 is connected to the output terminal of the first receiver 511, the clock terminal of the sixth flip-flop 515 is connected to a clock odd signal PCLK_O, and the output terminal of the sixth flip-flop 515 is configured to output a to-be-processed command odd signal CA[4:0]_1T_O.

As shown in FIG. 7, the second input circuit 412 may include a second receiver 512, a seventh flip-flop 516, a first inverter 517, an eighth flip-flop 518, and a second inverter 519. The input terminal of the second receiver 512 is configured to receive an initial chip select signal CS_n and the reference voltage signal VREFCA, and the output terminal of the second receiver 512 is configured to output an intermediate chip select signal (represented by PCS). The input terminal of the seventh flip-flop 516 is connected to the output terminal of the second receiver 512, the clock terminal of the seventh flip-flop 516 is connected to the clock even signal PCLK_E, and the output terminal of the seventh flip-flop 516 is connected to the first inverter 517. The output terminal of the first inverter 517 is configured to output a to-be-processed chip select signal PCS_E. The input terminal of the eighth flip-flop 518 is connected to the output terminal of the second receiver 512, the clock terminal of the eighth flip-flop 518 is connected to the clock odd signal PCLK_O, the output terminal of the eighth flip-flop 518 is connected to the second inverter 519, and the output terminal of the second inverter 519 is configured to output a to-be-processed chip select odd signal PCS_O.

It should be understood that since the intermediate chip select signal PCS is an active-low pulse signal, it is necessary to correspondingly provide a first inverter 517 and a second inverter 519 after the seventh flip-flop 516 and the eighth flip-flop 518, so that the intermediate sampling even signal PCS_E or the intermediate sampling odd signal PCS_O becomes an active-high pulse signal for subsequent logic operations. In addition, the first inverter 517 and the second inverter 519 may not be provided after the seventh flip-flop 516 and the eighth flip-flop 518, and the subsequent logic operations need to be adjusted accordingly to achieve the same effect.

It should also be noted that, as shown in FIG. 7, the clock receiving circuit 42 may include a third receiver 513. The input terminal of the third receiver 513 is configured to receive an initial clock signal CK_t/CK_c, and the output terminal of the third receiver 513 is configured to output a clock odd signal PCLK_O and a clock even signal PCLK_E. Here, CK_t/CK_c are a group of signals with the same clock cycle, but the phase difference therebetween is 180 degrees. PCLK_O/PCLK_E are also a group of signals with the same clock cycle, but the phase difference therebetween is 180 degrees, and the clock cycle of CK_t/CK_c is a preset clock cycle, and the clock cycle of PCLK_O/PCLK_E is twice the length of the preset clock cycle.

In this way, the clock odd signal PCLK_O, the clock even signal PCLK_E, the to-be-processed chip select odd signal PCS_O, the to-be-processed chip select even signal PCS_E, the to-be-processed command odd signal CA[4:0]_1T_O, and the to-be-processed command even signal CA[4:0]_1T_E are obtained by the signal input circuit 41 and the clock receiving circuit 42 for subsequent processing.

In some embodiments, as shown in FIG. 6, the sampling and logic circuit 43 may include a first sampling circuit 431, a second sampling circuit 432, a first logic circuit 433, and a second logic circuit 434.

The first sampling circuit 431 is configured to perform first-stage sampling processing on the to-be-processed chip select even signal using the clock odd signal to obtain a first chip select sampling odd signal, and to perform second-stage sampling processing on the first chip select sampling odd signal using the clock odd signal to obtain a second chip select sampling odd signal.

The second sampling circuit 432 is configured to perform first-stage sampling processing on the to-be-processed chip select odd signal using the clock even signal to obtain a first chip select sampling even signal, and to perform second-stage sampling processing on the first chip select sampling even signal using the clock even signal to obtain a second chip select sampling even signal.

The first logic circuit 433 is configured to perform logic operations on the clock odd signal, the first chip select sampling odd signal and the second chip select sampling odd signal to obtain a chip select clock odd signal.

The second logic circuit 434 is configured to perform logic operations on the clock even signal, the first chip select sampling even signal and the second chip select sampling even signal to obtain a chip select clock even signal.

Here, the chip select clock even signal and the chip select clock odd signal constitute the chip select clock signal.

It should be noted that, in the sampling and logic circuit 43, the first sampling circuit 431 and the first logic circuit 433 are configured to determine the chip select clock odd signal, and the second sampling circuit 432 and the second logic circuit 434 are configured to determine the chip select clock even signal.

In FIG. 6, the first chip select sampling odd signal here is represented by PCS_OD, the first chip select sampling even signal is represented by PCS_ED, the second chip select sampling odd signal is represented by PCS_ODD, the second chip select sampling even signal is represented by PCS_EDD, the chip select clock odd signal is represented by CS_CLK_O, and the chip select clock even signal here is represented by CS_CLK_E.

As mentioned above, at most one of the to-be-processed chip select odd signal PCS_O and the to-be-processed chip select even signal PCS_E is active. If the to-be-processed chip select even signal PCS_E is active, the first chip select sampling odd signal PCS_OD, the second chip select sampling odd signal PCS_ODD, and the chip select clock odd signal CS_CLK_O are active. If the to-be-processed chip select odd signal PCS_O is active, the first chip select sampling even signal PCS_ED, the second chip select sampling even signal PCS_EDD, and the chip select clock even signal CS_CLK_E are active.

In some embodiments, the first-stage sampling processing is rising edge sampling processing, and the second-stage sampling processing is falling edge sampling processing.

That is to say, the first sampling circuit 431 samples the to-be-processed chip select even signal PCS_E using the rising edge of the clock odd signal PCLK_O to obtain a first chip select sampling odd signal PCS_OD, and then samples the first chip select sampling odd signal PCS_OD using the falling edge of the clock odd signal PCLK_O to obtain a second chip select sampling odd signal PCS_ODD. In this way, when the to-be-processed chip select even signal PCS_E is active, the rising edge of the to-be-processed chip select even signal PCS_E, the rising edge of the first chip select sampling odd signal PCS_OD, and the rising edge of the second chip select sampling odd signal PCS_ODD are sequentially delayed by a preset clock cycle. Then, the first logic circuit 433 performs operation on the clock odd signal PCLK_O, the first chip select sampling odd signal PCS_OD and the second chip select sampling odd signal PCS_ODD to obtain a chip select clock odd signal CS_CLK_O having two pulses, each having a width of a preset clock cycle.

Similarly, the second sampling circuit 432 samples the to-be-processed chip select odd signal PCS_O using the rising edge of the clock even signal PCLK_E to obtain a first chip select sampling even signal PCS_ED, and then samples the first chip select sampling even signal PCS_ED using the falling edge of the clock even signal PCLK_E to obtain a second chip select sampling even signal PCS_EDD. In this way, when the to-be-processed chip select odd signal PCS_O is active, the rising edge of the to-be-processed chip select odd signal PCS_O, the rising edge of the first chip select sampling even signal PCS_ED, and the rising edge of the second chip select sampling even signal PCS_EDD are sequentially delayed by a preset clock cycle. Then, the second logic circuit 434 performs operation on the clock even signal PCLK_E, the first chip select sampling even signal PCS_ED and the second chip select sampling even signal PCS_EDD to obtain a chip select clock even signal CS_CLK_E having two pulses, each having a width of a preset clock cycle.

It should be noted that, in the embodiments of the disclosure, rising edge sampling may be selected for other types of sampling processing that are not explicitly described.

In this way, by two-stage sampling (rising edge sampling and falling edge sampling) and logic operation processing, the chip select clock signal (chip select clock odd signal or chip select clock even signal) with two pulses, each having a width of a preset clock cycle, can be obtained, thereby ensuring the pulse width of the target command signal is twice the length of the preset clock cycle, preventing the problem that the pulse width of the target command signal is uncertain, and preventing the occurrence of data errors in a high frequency environment or when PVT changes. In particular, "the pulse width of the target command signal is twice the length of the preset clock cycle" in the embodiment of the disclosure means that the deviation between the pulse width of the target command signal and twice the length of the preset clock cycle is within a preset accuracy range.

It should be understood that the purpose of the first-stage sampling and second-stage sampling is to ensure that the chip select clock signal obtained after subsequent logical processing includes two pulses, and the width of each pulse is a preset clock cycle. Therefore, taking the rising edge sampling as the first-stage sampling and the falling edge sampling as the second-stage sampling is only a feasible way, and does not constitute a relevant limitation.

When the first-stage sampling is rising edge sampling and the second-stage sampling is falling edge sampling, the first sampling circuit 431 and the second sampling circuit 432 may employ the following structures.

In a specific embodiment, as shown in FIG. 7, the first sampling circuit 431 may include a first flip-flop 501, a first NOT gate 502, and a second flip-flop 503.

The input terminal of the first flip-flop 501 is connected to a to-be-processed chip select even signal PCS_E, the clock terminal of the first flip-flop 501 is connected to a clock odd signal PCLK_O, the output terminal of the first flip-flop 501 is configured to output a first chip select sampling odd signal PCS_OD, the input terminal of the second flip-flop 503 is connected to the output terminal of the first flip-flop 501, the input terminal of the first NOT gate 502 is connected to a clock odd signal PCLK_O, the output terminal of the first NOT gate 502 is connected to the clock terminal of the second flip-flop 503, and the output terminal of the second flip-flop 503 is configured to output a second chip select sampling odd signal PCS_ODD.

It should be noted that, the clock odd signal PCLK_O is inverted by the first NOT gate 502, and then, the first chip select sampling odd signal PCS_OD is sampled using the rising edge of the inverted clock odd signal PCLK_O, so as to sample the first chip select sampling odd signal PCS_OD using the falling edge of the clock odd signal PCLK_O.

In a specific embodiment, as shown in FIG. 7, the second sampling circuit 432 may include a third flip-flop 504, a second NOT gate 505, and a fourth flip-flop 506.

The input terminal of the third flip-flop 504 is connected to a to-be-processed chip select odd signal PCS_O, the clock terminal of the third flip-flop 504 is connected to a clock even signal PCLK_E, the output terminal of the third flip-flop 504 is configured to output a first chip select sampling even signal PCS_ED, the input terminal of the fourth flip-flop 506 is connected to the output terminal of the third flip-flop 504, the input terminal of the second NOT gate 505 is connected to a clock even signal PCLK_E, the output terminal of the second NOT gate 505 is connected to the clock terminal of the fourth flip-flop 506, and the output terminal of the fourth flip-flop 506 is configured to output a second chip select sampling even signal PCS_EDD.

It should be noted that, the clock even signal PCLK_E is inverted by the second NOT gate 505, and then the first chip select sampling even signal PCS_ED is sampled using the rising edge of the inverted clock even signal PCLK_E, so as to sample the first chip select sampling even signal PCS_ED using the falling edge of the clock even signal PCLK_E.

For example, the first flip-flop 501, second flip-flop 503, third flip-flop 504, fourth flip-flop 506, fifth flip-flop 514, sixth flip-flop 515, seventh flip-flop 516, and eighth flip-flop 518 mentioned above may all be DFFs.

In a specific embodiment, as shown in FIG. 6 and FIG. 7, the first logic circuit 433 may include a first OR gate 507 and a first AND gate 508.

The first OR gate 507 is configured to perform OR operation on the first chip select sampling odd signal PCS_OD and the second chip select sampling odd signal PCS_ODD to obtain an intermediate odd signal.

The first AND gate 508 is configured to perform AND operation on the intermediate odd signal and the clock odd signal PCLK_O to obtain a chip select clock odd signal CS_CLK_O.

It should be noted that, when the first chip select sampling odd signal PCS_OD and the second chip select sampling odd signal PCS_ODD are active, the OR operation performed on the first chip select sampling odd signal PCS_OD and the second chip select sampling odd signal PCS_ODD can widen the pulse width, and the pulse width of the intermediate odd signal obtained is 3 times of the preset clock cycle. The intermediate odd signal and the clock odd signal PCLK_O are then subject to AND logic operation, the obtained chip select clock odd signal CS_CLK_O has two pulses, and the pulse width is a preset clock cycle. In this way, subsequent sampling and decoding are performed by using the chip select clock odd signal, so that the pulse width of the final output target command signal is twice the length of the preset clock cycle.

In addition, when the first chip select sampling odd signal PCS_OD and the second chip select sampling odd signal PCS_ODD are inactive, the chip select clock odd signal CS_CLK_O is in an inactive state.

In a specific embodiment, the second logic circuit 434 may include a second OR gate 509 and a second AND gate 510.

The first OR gate 509 is configured to perform OR operation on the first chip select sampling even signal PCS_ED and the second chip select sampling even signal PCS_EDD to obtain an intermediate odd signal.

The second AND gate 510 is configured to perform AND operation on the intermediate even signal and the clock odd signal PCLK_E to obtain a chip select clock even signal CS_CLK_E.

It should be noted that when the first chip select sampling even signal PCS_ED and the second chip select sampling even signal PCS_EDD are active, OR operation performed on the first chip select sampling even signal PCS_ED and the second chip select sampling even signal PCS_EDD can widen the pulse width, and the pulse width of the obtained intermediate even signal is 3 times of the preset clock cycle. The intermediate even signal and the clock even signal PCLK_E are then subject to AND logic operation, the obtained chip select clock even signal CS_CLK_E has two pulses, and the pulse width is a preset clock cycle.

In addition, when the first chip select sampling even signal PCS_ED and the second chip select sampling even signal PCS_EDD are inactive, the chip select clock even signal CS_CLK_E is also in an inactive state.

In this way, the sampling and logic circuit 43 performs two-stage sampling and logic operations on the to-be-processed chip select odd signal PCS_O/the to-be-processed chip select even signal PCS_E using the clock odd signal PCLK_O/clock even signal PCLK_E to obtain a chip select clock odd signal CS_CLK_O/chip select clock even signal CS_CLK_E. Subsequently, decoding and sampling processing is performed on the to-be-processed command odd signal CA[4:0]_1T_O/to-be-processed command even signal CA[4:0]_1T_E according to the two pairs of signals, i.e., the to-be-processed chip select odd signal PCS_O/to-be-processed chip select even signal PCS_E and the chip select clock odd signal CS_CLK_O/chip select clock even signal CS_CLK_E, so that the pulse width of the final output target command signal is twice the length of the preset clock cycle.

In some embodiments, as shown in FIG. 6 and FIG. 7, the decoding circuit 44 may include a first command decoding circuit 441, a second command decoding circuit 442, and a third OR gate 443.

The first command decoding circuit 441 is configured to decode and sample the to-be-processed command even signal CA[4:0]_1T_E according to the to-be-processed chip select even signal PCS_E and the chip select clock odd signal CS_CLK_O to obtain a command even signal CMD_E.

The second command decoding circuit 442 is configured to decode and sample the to-be-processed command odd signal CA[4:0]_1T_O according to the to-be-processed chip select odd signal PCS_O and the chip select clock even signal CS_CLK_E to obtain a command odd signal CMD_O.

The third OR gate 443 is configured to perform OR operation on the command even signal CMD_E and the command odd signal CMD_O to obtain a target command signal CMD.

It should be noted that, according to the function of the initial chip select signal CS_n mentioned above, if the initial chip select signal CS_n is sampled as a low level at the rising edge of the even clock cycle, the chip select even signal PCS_E and the to-be-processed chip select clock odd signal CS_CLK_O are active. In this case, the command even signal CMD_E output by the first command decoding circuit 441 is active, and the command odd signal CMD_O output by the second command decoding circuit 442 is inactive. The command even signal CMD_E is output as the target command signal CMD by the third OR gate 443. In the opposite situation, if the initial chip select signal CS_n is sampled as a low level at the rising edge of the odd clock cycle, the to-be-processed chip select odd signal PCS_O and chip select clock even signal CS_CLK_E are active. In this case, the command odd signal CMD_O output by the second command decoding circuit 442 is active, and the command even signal CMD_E output by the first command decoding circuit 441 is inactive. The command odd signal CMD_O is output as the target command signal CMD by the third OR gate 443.

In other words, in one case, the initial chip select signal is a signal representing that the target chip is selected, and the initial chip select signal is an active-low pulse signal. If the initial chip select signal is sampled as a low level at a rising edge of an even clock cycle, the to-be-processed chip select even signal is an active-high pulse signal. Correspondingly, the rising edge of the first pulse in the chip select clock odd signal is used for generating the rising edge of the target command signal, and the rising edge of the second pulse in the chip select clock odd signal is used for generating the falling edge of the target command signal.

In the other case, if the initial chip select signal is sampled as a low level at a rising edge of an odd clock cycle, the to-be-processed chip select odd signal is an active-high pulse signal. Correspondingly, the rising edge of the first pulse in the chip select clock even signal is used for generating the rising edge of the target command signal, and the rising edge of the second pulse in the chip select clock even signal is used for generating the falling edge of the target command signal.

In this way, since the active signal in the chip select clock signal (chip select clock odd signal CS_CLK_O or chip select clock even signal CS_CLK_E) includes two pulses, where the pulse width of each pulse is a preset clock cycle, and the rising edge of the first pulse is used for generating the rising edge of the target command signal CMD, and the rising edge of the second pulse is used for generating the falling edge of the target command signal CMD, the pulse width of the final output target command signal CMD is twice the length of the preset clock cycle, that is, the deviation between the pulse width of the target command signal CMD and twice the length of the preset clock cycle is within a preset accuracy range.

It should be noted that the specific designs of the first command decoding circuit 441 and the second command decoding circuit 442 are determined according to command decoding rules. For different products/different application scenarios/different commands, the decoding rules may be different, and thus, the logic of the command decoding circuit can also be adjusted accordingly.

Figure 8A:
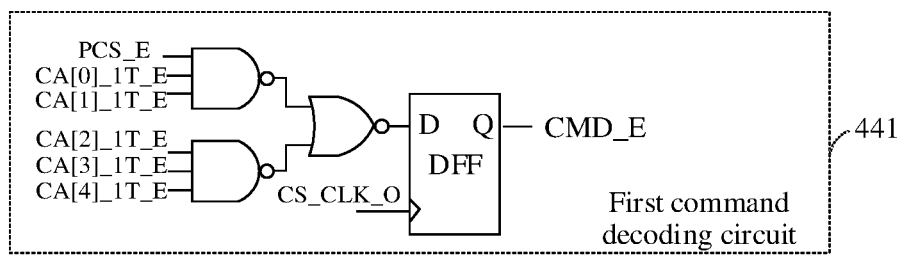
FIG. 8A is a schematic structural diagram of a first command decoding circuit according to an embodiment of the disclosure.

In a specific embodiment, as shown in FIG. 8A, the first command decoding circuit 441 may include a first decoding circuit and a third sampling circuit.

The first decoding circuit is configured to perform decoding processing on the to-be-processed command even signal CA[4:0]_1T_E and the to-be-processed chip select even signal PCS_E to obtain a command decoded even signal.

The third sampling circuit is configured to perform sampling processing on the command decoded even signal according to the chip select clock odd signal CS_CLK_O to obtain the command even signal CMD_E.

It should be noted that, in FIG. 8A, the to-be-processed command even signal CA[4:0]_1T_E may include command signals such as CA[0]_1T_E, CA[1]_1T_E, CA[2]_1T_E, CA[3]_1T_E, and CA[4]_1T_E, and the first decoding circuit may be composed of a three-input NAND gate, a three-input NAND gate, and a two-input NOR gate. As shown in FIG. 8A, PCS_E, CA[0]_1T_E and CA[1]_1T_E are input to the first three-input NAND gate, and CA[2]_1T_E, CA[3]_1T_E, and CA[4]_1T_E are input to the second three-input NAND gate. Then, an output terminal of the first three-input NAND gate is connected to one input terminal of the two-input NOR gate, an output terminal of the second three-input NAND gate is connected to the other input terminal of the two-input NOR gate, and an output terminal of the two-input NOR gate is configured to output the command decoded even signal, so that the decoding of the to-be-processed chip select even signal PCS_E and the to-be-processed command even signal CA[4:0]_1T_E is achieved.

It should be noted that the specific design of the first command decoding circuit 441 is determined according to the command decoding rules. For different products/different application scenarios/different commands, the decoding rules may be different, and the logic of the command decoding circuit can also be adjusted accordingly.

After the command decoded even signal is obtained, sampling and outputting are carried out by the third sampling circuit. Specifically, the third sampling circuit may be a DFF. The clock terminal of the DFF is connected to the chip select clock odd signal CS_CLK_O, the input terminal of the DFF is connected to the output terminal of the two-input NOR gate, and the output terminal of the DFF is configured to output the command even signal CMD_E.

Figure 8B:
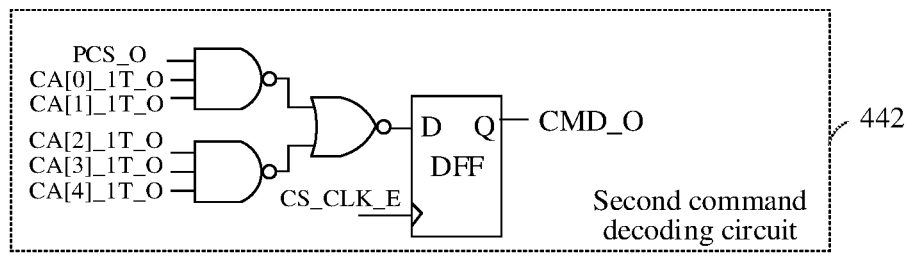
FIG. 8B is a schematic structural diagram of a second command decoding circuit according to an embodiment of the disclosure.

Similarly, in a specific embodiment, as shown in FIG. 8B, the second command decoding circuit 442 includes a second decoding circuit and a fourth sampling circuit.

The second decoding circuit is configured to perform decoding processing on the to-be-processed command odd signal CA[4:0]_1T_O and the to-be-processed chip select odd signal PCS_O to obtain a command decoded even signal.

The fourth sampling circuit is configured to perform sampling processing on the command decoded odd signal according to the chip select clock even signal CS_CLK_E to obtain the command odd signal CMD_O.

It should be noted that, in FIG. 8B, the to-be-processed command odd signal CA[4:0]_1T_O may include command signals such as CA[0]_1T_O, CA[1]_1T_O, CA[2]_1T_O, CA[3]_1T_O, and CA[4]_1T_O, and the second decoding circuit may be composed of a three-input NAND gate, a three-input NAND gate, and a two-input NOR gate. As shown in FIG. 8B, PCS_O, CA[0]_1T_O, and CA[1]_1T_O are input to the first three-input NAND gate, and CA[2]_1T_O, CA[3]_1T_O, and CA[4]_1T_O are input to the second three-input NAND gate. Then, an output terminal of the first three-input NAND gate is connected to one input terminal of the two-input NOR gate, an output terminal of the second three-input NAND gate is connected to the other input terminal of the two-input NOR gate, and an output terminal of the two-input NOR gate is configured to output the command decoded odd signal, so that the decoding of the to-be-processed chip select odd signal PCS_O and the to-be-processed command odd signal CA[4:0]_1T_O is achieved.

It should be noted that the specific design of the second command decoding circuit 442 is determined according to the command decoding rules. For different products/different application scenarios/different commands, the decoding rules may be different, and the logic of the command decoding circuit can also be adjusted accordingly.

After the command decoded odd signal is obtained, sampling and outputting are carried out by the fourth sampling circuit. Specifically, the fourth sampling circuit may be a DFF. The clock terminal of the DFF is connected to the chip select clock even signal CS_CLK_E, the input terminal of the DFF is connected to the output terminal of the two-input NOR gate, and the output terminal of the DFF is configured to output the command odd signal CMD_O.

It can be seen from the above that two-stage sampling and logic operation are performed on the to-be-processed chip select signal by the signal sampling circuit using the first clock signal to obtain a chip select clock signal, where the chip select clock signal includes two pulses, and the width of each pulse is a preset clock cycle, so that the rising edge of the first pulse of the chip select clock signal is used for generating the rising edge of the target command signal, and the rising edge of the second pulse of the chip select clock signal is used for generating the falling edge of the target command signal. In this way, the pulse width of the final output target command signal is twice the length of the preset clock cycle, thereby preventing the problem that the pulse width of the target command signal is uncertain, and preventing the occurrence of data errors in a high-frequency environment or when PVT changes.

The embodiments of the disclosure provide a signal sampling circuit. The signal sampling circuit includes a signal input circuit, a clock receiving circuit, a sampling and logic circuit, and a decoding circuit, where the signal input circuit is configured to determine a to-be-processed command signal and a to-be-processed chip select signal; the clock receiving circuit is configured to receive an initial clock signal and perform frequency division processing on the initial clock signal to obtain a first clock signal, where a clock cycle of the initial clock signal is a preset clock cycle, and a clock cycle of the first clock signal is twice the length of the preset clock cycle; the sampling and logic circuit is configured to perform two-stage sampling processing and logic operation processing on the to-be-processed chip select signal according to the first clock signal to obtain a chip select clock signal, where the chip select clock signal includes two pulses, and the width of each pulse is a preset clock cycle; and the decoding circuit is configured to perform decoding processing and sampling processing on the to-be-processed command signal according to the to-be-processed chip select signal and the chip select clock signal to obtain a target command signal. In this way, after processing by the signal sampling circuit, the chip select clock signal includes two pulses, and the width of each pulse is a preset clock cycle, such that the pulse width of the target command signal after decoding and sampling will not deviate with changes in process, voltage, temperature, etc., thereby mitigating the problem of uncertainty in the pulse width of the target command signal, improving signal quality, and preventing data failure.

Figure 9:
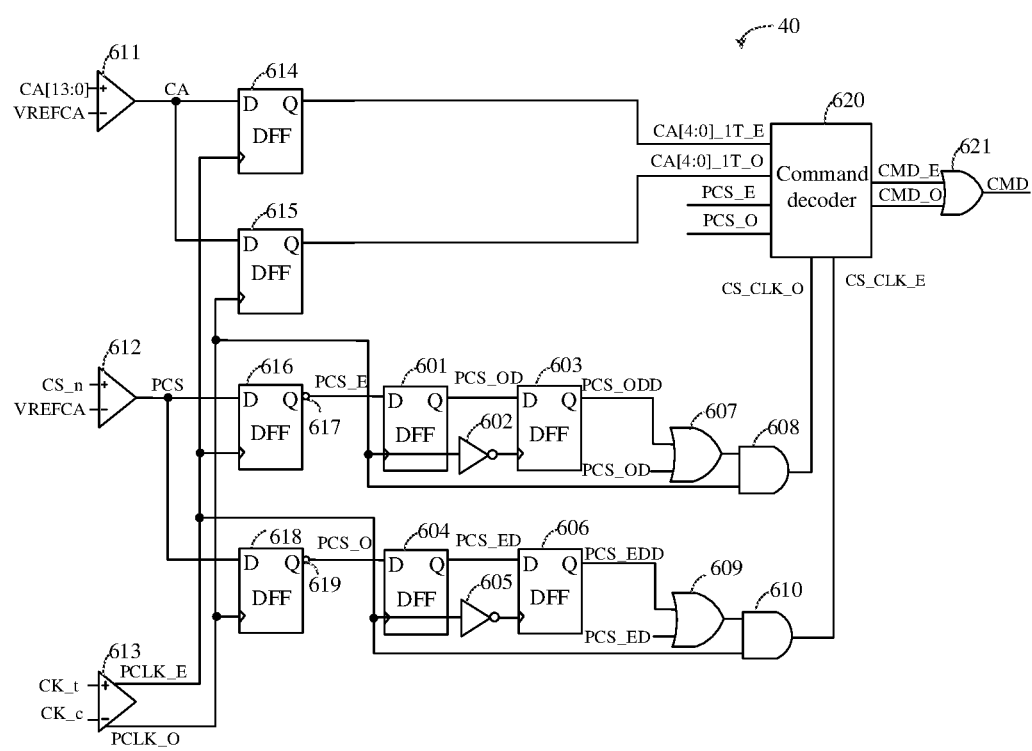
FIG. 9 is a detailed schematic structural diagram of a signal sampling circuit according to an embodiment of the disclosure.

In another embodiment of the disclosure, on the basis of the signal sampling circuit according to the embodiments above, FIG. 9 illustrates a schematic structural diagram of a signal sampling circuit 40 according to the embodiment of the disclosure. As shown in FIG. 9, the signal sampling circuit 40 may include a first receiver 611, a second receiver 612, a third receiver 613, a fifth flip-flop 614, a sixth flip-flop 615, a seventh flip-flop 616, a first inverter 617, an eighth flip-flop 618, a second inverter 619, a first flip-flop 601, a first NOT gate 602, a second flip-flop 603, a third flip-flop 604, a second NOT gate 605, a fourth flip-flop 606, a first OR gate 607, a first AND gate 608, a second OR gate 609, a second AND gate 610, a command decoder 620, and a third OR gate 621. The first flip-flop 601, the second flip-flop 603, the third flip-flop 604, the fourth flip-flop 606, the fifth flip-flop 614, the sixth flip-flop 615, the seventh flip-flop 616, and the eighth flip-flop 618 may all be DFFs. In addition, the command decoder 620 may include a first command decoding circuit and a second command decoding circuit, and the specific structure is as shown in FIG. 8A and FIG. 8B.

In FIG. 9, first, input signals of the first receiver 611 are an initial command signal (represented by CA[13:0]) and a reference signal (represented by VREFCA), and an output signal is the intermediate command signal (represented by CA). It should be noted that the initial command signal and the intermediate command signal are not single signals, but each represents a group of signals, that is, CA[13:0] includes CA[13] to CA[0]. One first receiver 611 and one fifth flip-flop 614 are needed for each signal, and thus, in the embodiment of the disclosure, 14 first receivers 611 and 14 fifth flip-flops 614 are needed. Only one first receiver 611 and one fifth flip-flop 614 are shown in the figure for illustration. Input signals of the second receiver 612 are an initial chip select signal (represented by CS_n) and a reference signal (represented by VREFCA), and an output signal is an intermediate chip select signal (represented by PCS). An input signal of the third receiver 613 is an initial clock signal (including a CK_t signal and a CK_c signal), and output signals obtained after frequency division processing are a clock even signal (represented by PCLK_E) and a clock odd signal (represented by PCLK_O). Here, the clock cycle of CK_t/CK_c is a preset clock cycle, and the clock period of PCLK_E_/PCLK_O is twice the length of the preset clock period.

In addition, the intermediate command signal CA is sampled by the fifth flip-flop 614 using the clock even signal PCLK_E to obtain a to-be-processed command even signal (represented by CA[4:0]_1T_E); the intermediate command signal CA is sampled by the sixth flip-flop 615 using the clock odd signal PCLK_O to obtain a to-be-processed command odd signal (represented by CA[4:0]_1T_O); the intermediate chip select signal PCS is sampled and inverted by the seventh flip-flop 616 and the first inverter 617 using the clock even signal PCLK_E to obtain a to-be-processed chip select signal (represented by PCS_E); and the intermediate chip select signal PCS is sampled and inverted by the eighth flip-flop 618 and the second inverter 619 using the clock odd signal PCLK_O to obtain a to-be-processed chip select odd signal (represented by PCS_O). It should be noted that CA[4:0] includes CA[4] to CA[0], that is, the first five signals in the initial command signal CA[13:0] are received and sampled to form a to-be-processed command odd signal CA[4:0]_1T_O and a to-be-processed command even signal CA[4:0]_1T_E.

Then, the PCS_E is sampled by the first flip-flop 601 using the rising edge of the clock odd signal PCLK_O to obtain a first chip select sampling odd signal (represented by PCS_OD); the first chip select sampling odd signal PCS_OD is sampled the first NOT gate 602 and the second flip-flop 603 using the falling edge of the clock odd signal PCLK_O to obtain a second chip select sampling odd signal (represented by PCS_ODD); OR operation is performed on the first chip select sampling odd signal PCS_OD and the second chip select sampling odd signal PCS_ODD by the first OR gate 607 to obtain an intermediate odd signal; and AND operation is performed on the intermediate odd signal and the clock odd signal PCLK_O by the second AND gate 610 to obtain a chip select clock odd signal (represented by CS_CLK_O). Similarly, the to-be-processed chip select odd signal PCS_O is sampled by the third flip-flop 604 using the rising edge of the clock even signal PCLK_E to obtain a first chip select sampling even signal (represented by PCS_ED); the first chip select sampling even signal PCS_ED is sampled by the second NOT gate 605 and the fourth flip-flop 606 using the falling edge of the clock even signal PCLK_E to obtain a second chip select sampling even signal (represented by PCS_EDD); OR operation is performed on the first chip select sampling even signal PCS_ED and the second chip select sampling even signal PCS_EDD by the second OR gate 609 to obtain an intermediate even signal; and AND operation is performed on the intermediate even signal and the clock even signal PCLK_E by the second AND gate 610 to obtain a chip select clock even signal (represented by CS_CLK_E). Here, there is at most one active signal in the chip select clock even signal CS_CLK_E and the chip select clock odd signal CS_CLK_O.

Finally, the command decoder 620 performs decoding and sampling processing on the to-be-processed command even signal CA[4:0]_1T_E/to-be-processed command odd signal CA[4:0]_1T_O and the to-be-processed chip select even signal PCS_E/to-be-processed chip select odd signal PCS_O by using the chip select clock even signal CS_CLK_E/chip select clock odd signal CS_CLK_O to obtain a command even signal (represented by CMD_E) and a command odd signal (represented by CMD_O), and then, OR logic operation is performed on the command even signal CMD_E and the command odd signal CMD_O by the third OR gate 621 to obtain a target command signal (represented by CMD).

For the detailed operating principle of the signal sampling circuit 40, reference may be made to the foregoing embodiments. No repeated description is provided here.

In this way, by the above processing, there are two pulses in an active signal in the chip select clock even signal CS_CLK_E/chip select clock odd signal CS_CLK_O, and the width of each pulse is a preset clock cycle. After sampling the decoded command signal by using the two pulses of the active signal in the chip select clock even signal CS_CLK_E/chip select clock odd signal CS_CLK_O, the pulse width of the obtained target command signal CMD is twice the length of the preset clock period, and will not change with the PVT, such that the error caused by a failure due to the uncertainty in the pulse width of the target command signal CMD in the case of a high frequency and a change in PVT can be prevented. In particular, "the pulse width of the target command signal is twice the length of the preset clock cycle" in the embodiment of the disclosure means that the deviation between the pulse width of the target command signal and twice the length of the preset clock cycle is within a preset accuracy range.

Figure 10:
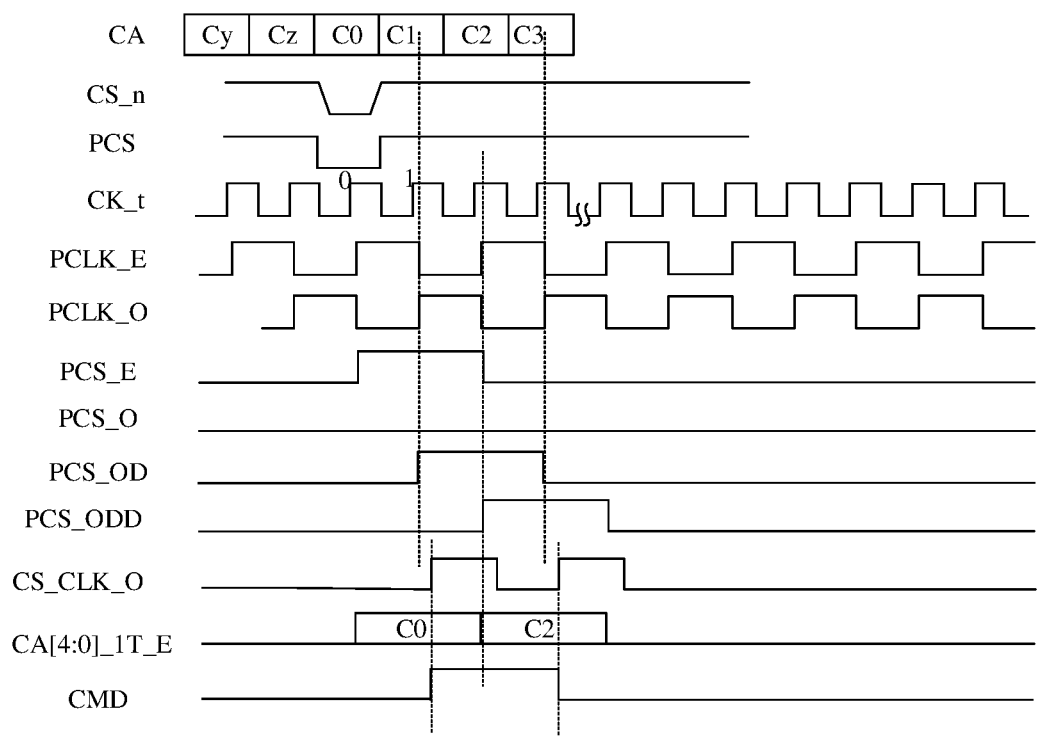
FIG. 10 is a schematic diagram of the signal time series of a signal sampling circuit according to an embodiment of the disclosure.

In a specific scenario, it is assumed that the initial command signal is sampled at an even clock edge and is active low. In this case, the signal time series diagram of the signal sampling circuit 40 shown in FIG. 9 is as shown in FIG. 10. In FIG. 10, the intermediate command signal is represented by CA, and CA may include Cy, Cz, C0, C1, C2, and C3. The initial chip select signal is represented by CS_n, the intermediate chip select signal is represented by PCS. PCS is an active-low pulse signal, and the pulse width is a preset clock cycle. PCS is used for representing the signal indicating that a target chip is selected. Please refer to the above for the descriptions of other signals. Here, the even clock cycle or the odd clock cycle refers to the clock cycle of the initial clock signal CK_t/CK_c. Specifically, after frequency division processing of the third receiver 613, a clock odd signal PCLK_E and a clock even signal PCLK_O can be obtained. Then, the clock cycle at which the rising edge of the clock even signal PCLK_E is located is regarded as an even clock cycle, and the clock cycle at which the rising edge of the clock odd signal PCLK_O is located is regarded as an odd clock cycle.

The intermediate command signal is sampled using CA by the rising edge of the clock even signal PCLK_E to obtain a to-be-processed command even signal CA[4:0]_1T_E, which includes C0 and C2. After the initial chip select signal CS_n is received, an intermediate chip select signal PCS is generated. After first-stage sampling and inversion processing is performed on the intermediate chip select signal PCS using the rising edge of the clock even signal PCLK_E, a to-be-processed chip select signal PCS_E is obtained. After second-stage sampling is performed on the to-be-processed chip select even signal PCS_E by using the clock odd signal PCLK_O, a first chip select sampling odd signal PCS_OD is obtained. After third-stage sampling is performed on the first chip select sampling odd signal PCS_OD using the clock odd signal PCLK_O, a second chip select sampling odd signal PCS_ODD is obtained. Similarly, after first-stage sampling and inversion processing is performed on the intermediate chip select signal PCS using the rising edge of the clock odd signal PCLK_O signal, a to-be-processed chip select odd signal (represented by PCS_O) is obtained. After second-stage sampling is performed on the to-be-processed chip select odd signal PCS_O using the clock even signal PCLK_E, a first chip select sampling even signal PCS_ED is obtained. After third-stage sampling is performed on the first chip select sampling even signal PCS_ED using the clock even signal PCLK_E, a second chip select sampling even signal PCS_EDD is obtained.

It should be noted that the samplings are numbered starting from the intermediate chip select signal PCS. In the foregoing embodiments, the numbering of samplings is started with the to-be-processed chip select odd signal PCS_O/to-be-processed chip select even signal PCS_E as the starting point. Therefore, in this embodiment, the second-stage sampling corresponds to the aforementioned first-stage sampling, and the third-stage sampling corresponds to the aforementioned second-stage sampling. Similarly, the third-stage sampling is falling edge sampling, and the other unspecified samplings can be selected as rising edge sampling.

In this scenario, the initial chip select signal CS_n is sampled at an even clock edge and is active low. Therefore, the to-be-processed chip select even signal PCS_E, the first chip select sampling odd signal PCS_OD and the second chip select sampling odd signal PCS_ODD are all active—high pulse signals, and the rising edges of the to-be-processed chip select even signal PCS_E, the first chip select sampling odd signal PCS_OD and the second chip select sampling odd signal PCS_ODD are sequentially different by one preset clock cycle. By performing logic operations on the first chip select sampling odd signal PCS_OD, the second chip select sampling odd signal PCS_ODD, and the clock odd signal PCLK_O, a chip select clock odd signal CS_CLK_O is obtained. As shown in FIG. 10, the chip select clock odd signal CS_CLK_O includes two pulses, and the width of each pulse is a preset clock period.

After the chip select clock odd signal CS_CLK_O is obtained, the aforementioned command decoder 620 is used to decode the to-be-processed command even signal CA[4:0]_1T_E and the to-be-processed chip select even signal PCS_E, and the chip select clock odd signal CS_CLK_O is used as the clock signal to carry out sampling and outputting to obtain a target command signal CMD. As shown in FIG. 10, the rising edge of a first pulse in the chip select clock odd signal CS_CLK_O is used for generating the rising edge of the target command signal CMD, and a rising edge of a second pulse in the chip select clock odd signal CS_CLK_O is used for generating the falling edge of the target command signal, thereby ensuring that the pulse width of the target command signal CMD is twice the length of the preset clock period.

In addition, in this scenario, since the initial clock signal CS_n is sampled at an even clock edge and is active low, the to-be-processed chip select odd signal PCS_O, the first chip select sampling even signal PCS_ED and the second chip select sampling even signal PCS_EDD are low-level inactive signals, and the calculated chip select clock even signal CS_CLK_E is also an inactive signal, and thus the command decoder 620 will not carry out sampling and outputting using the chip select clock even signal CS_CLK_E.

Of course, in another scenario, it is assumed that the initial chip select signal CS_n is sampled at an odd clock edge and is active low. In this case, the chip select even signal PCS_E, the first chip select sampling odd signal PCS_OD, the second chip select sampling odd signal PCS_ODD, and the chip select clock odd signal CS_CLK_O will be in an inactive state; and the to-be-processed chip select odd signal PCS_O, the first chip select sampling even signal PCS_ED, the second chip select sampling even signal PCS_EDD, and the chip select clock even signal CS_CLK_E will be in an active state, where the chip select clock even signal CS_CLK_E includes two pulses, and the width of each pulse is a preset clock cycle. In this way, the command decoder 620 will carry out sampling and outputting according to the chip select clock even signal CS_CLK_E to obtain the target command signal CMD signal. The rising edge of the first pulse in the chip select clock even signal CS_CLK_E is used for generating the rising edge of the target command signal CMD, and the rising edge of the second pulse in the chip select clock even signal CS_CLK_E is used for generating the falling edge of the target command signal CMD, thereby also ensuring that the pulse width of CMD is twice the length of the preset clock period.

To put it simply, as shown in FIG. 9 and FIG. 10, the intermediate command signal CA containing C0 and the intermediate chip select signal PCS which is active low are sampled at a first stage by the clock even signal PCLK_E to generate a to-be-processed chip select even signal PCS_E and a to-be-processed command even signal CA[4:0]_1T_E; next, the to-be-processed chip select even signal PCS_E is sampled at a second stage by the rising edge of the clock odd signal PCLK_O to generate a first chip select sampling odd signal PCS_OD; and the first chip select sampling odd signal PCS_OD is then sampled at a third stage by the falling edge of the clock odd signal PCLK_O to generate a second chip select sampling odd signal PCS_ODD. After the OR logic is performed using the first chip select sampling odd signal PCS_OD and the second chip select sampling odd signal PCS_ODD, an active pulse of the clock odd signal PCLK_O is selected, the chip select clock odd signal CS_CLK_O having two pulses is generated, and the width of each pulse is a preset clock period.

Here, the OR operation performed on the first chip select sampling odd signal PCS_OD and the second chip select sampling odd signal PCS_ODD is to widen the pulse width, and the pulse width of the intermediate odd signal obtained is 3 times of the preset clock cycle. The intermediate odd signal and the clock odd signal PCLK_O are then subject to AND logic operation, the obtained chip select clock odd signal CS_CLK_O has two pulses, and the pulse width is a preset clock cycle. For the chip select clock odd signal CS_CLK_O, the first pulse is used for sampling and outputting the target command signal CMD, and the second pulse is used for generating the falling edge of the target command signal CMD. In this way, the pulse width of the target command signal CMD is twice the length of the preset clock period, and the pulse width does not change with the PVT. An error caused by a failure due to the uncertainty in the pulse width of the target command signal CMD in the case of a high frequency and a change in PVT can thus be prevented.

An embodiment of the disclosure provides a signal sampling circuit, and the specific implementation of the foregoing embodiments is described in detail in this embodiment. It can be seen that the embodiments of the disclosure are optimized on the basis of the existing direct sampling and decoding to cause the chip select clock signal to include two pulses, each having a width of a preset clock cycle, such that the pulse width of the decoded target command signal is twice the length of the preset clock cycle, and the pulse width of the target command signal will not deviate with changes in process, voltage, temperature, etc., thereby mitigating the problem of uncertainty in the pulse width of the target command signal, improving the signal quality, and preventing data failure.

Figure 11:
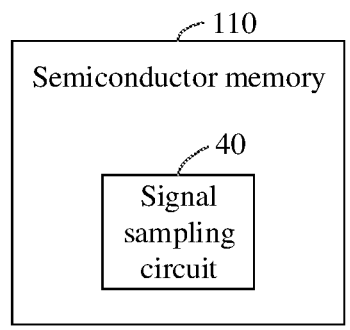
FIG. 11 is a schematic structural diagram of a semiconductor memory according to an embodiment of the disclosure.

In another embodiment of the disclosure, FIG. 11 illustrates a schematic structural diagram of a semiconductor memory 110 according to the embodiment of the disclosure. As shown in FIG. 11, the semiconductor memory 110 may include the signal sampling circuit 40 according to any one of the foregoing embodiments.

In the embodiments of the disclosure, the semiconductor memory 110 may be a DRAM chip.

Furthermore, in some embodiments, the DRAM chips conform to the DDR5 memory specification.

It should be noted that the embodiments of the disclosure mainly relate to circuits related to command decoding in integrated circuit design. The embodiments of the disclosure are optimized for 2T CMD on the basis of the existing direct sampling and decoding to cause the chip select clock signal to include two pulses, each having a width of a preset clock cycle, so that the pulse width of the decoded target command signal is twice the length of the preset clock cycle.

It is also to be noted that the embodiments of the disclosure may be applied to a control circuit for command/address signal sampling and decoding in the DRAM chip, but are not limited to this scope. Other circuits related to input signal sampling and command decoding may also employ this design.

In this way, in the embodiments of the disclosure, the semiconductor memory 110 includes a signal sampling circuit 40, and the pulse width of the target command signal will not deviate with changes in process, voltage, temperature, etc., thereby mitigating the problem of uncertainty in the pulse width of the target command signal, improving signal quality, and preventing data failure.

The above are only preferred embodiments of the disclosure, and are not intended to limit the scope of protection of the disclosure.

It is to be noted that, the terms "including", "comprising" or any other variants thereof in the disclosure are intended to cover non-exclusive inclusion, so that a process, method, article or apparatus including a series of elements not only includes those elements, but also includes other elements that are not explicitly listed, or elements inherent to the process, method, article or apparatus. Without more restrictions, the element defined by the sentence "including a . . . " does not exclude the existence of other identical elements in the process, method, article or apparatus including the element.

The serial numbers of the embodiments of the disclosure are only for the purpose of description but do not represent the preference of the embodiments. The methods disclosed in the method embodiments provided in the disclosure can be combined arbitrarily as long as there is no conflict to obtain new method embodiments. The features disclosed in the product embodiments provided in the disclosure can be combined arbitrarily as long as there is no conflict to obtain new product embodiments. The features disclosed in the method or device embodiments provided in the disclosure can be combined arbitrarily as long as there is no conflict to obtain new method or device embodiments.

The descriptions above are only implementations of the disclosure. However, the scope of protection of the disclosure is not limited thereto. Within the technical scope disclosed by the disclosure, any variation or substitution that can be easily conceived of by those skilled in the art should all fall within the scope of protection of the disclosure. Therefore, the scope of protection of the disclosure should be subject to the scope of protection of the claims.

INDUSTRIAL APPLICABILITY

Embodiments of the disclosure provide a signal sampling circuit and a semiconductor memory. The signal sampling circuit includes a signal input circuit, a clock receiving circuit, a sampling and logic circuit, and a decoding circuit, where the signal input circuit is configured to determine a to-be-processed command signal and a to-be-processed chip select signal; the clock receiving circuit is configured to receive an initial clock signal and perform frequency division processing on the initial clock signal to obtain a first clock signal, where a clock cycle of the initial clock signal is a preset clock cycle, and a clock cycle of the first clock signal is twice the length of the preset clock cycle; the sampling and logic circuit is configured to perform two-stage sampling processing and logic operation processing on the to-be-processed chip select signal according to the first clock signal to obtain a chip select clock signal, where the chip select clock signal includes two pulses, and the width of each pulse is a preset clock cycle; and the decoding circuit is configured to perform decoding processing and sampling processing on the to-be-processed command signal according to the to-be-processed chip select signal and the chip select clock signal to obtain a target command signal. In this way, after processing by the signal sampling circuit, the chip select clock signal includes two pulses, and the width of each pulse is a preset clock cycle, such that the pulse width of the target command signal after decoding and sampling will not deviate with changes in process, voltage, temperature, etc., thereby mitigating the problem of uncertainty in the pulse width of the target command signal and preventing data failure.

The invention claimed is:

1. A signal sampling circuit, comprising a signal input circuit, a clock receiving circuit, a sampling and logic circuit, and a decoding circuit,
   wherein the signal input circuit is configured to determine a to-be-processed command signal and a to-be-processed chip select signal;
   the clock receiving circuit is configured to receive an initial clock signal and perform frequency division processing on the initial clock signal to obtain a first clock signal, wherein a clock cycle of the initial clock signal is a preset clock cycle, and a clock cycle of the first clock signal is twice the length of the preset clock cycle;
   the sampling and logic circuit is configured to perform two-stage sampling processing and logic operation processing on the to-be-processed chip select signal according to the first clock signal to obtain a chip select clock signal, wherein the chip select clock signal comprises two pulses, and a width of each pulse is the preset clock cycle; and the decoding circuit is configured to receive the to-be-processed chip select signal and perform decoding processing and sampling processing on the to-be-processed command signal according to the to-be-processed chip select signal and the chip select clock signal to obtain a target command signal.

2. The signal sampling circuit of claim 1, wherein:
the target command signal comprises a pulse, and a width of the pulse is twice the length of the preset clock cycle, wherein a rising edge of a first pulse in the chip select clock signal is used for generating a rising edge of the target command signal, and a rising edge of a second pulse in the chip select clock signal is used for generating a falling edge of the target command signal.

3. The signal sampling circuit of claim 1, wherein the first clock signal comprises a clock odd signal and a clock even signal,
wherein the clock cycles of the clock odd signal and the clock even signal are both twice the length of the preset clock cycle, and a phase difference between the clock odd signal and even the clock signal is 180 degrees.

4. The signal sampling circuit of claim 3, wherein the signal input circuit comprises a first input circuit and a second input circuit,
wherein the first input circuit is configured to: receive an initial command signal and output an intermediate command signal, and
perform sampling processing on the intermediate command signal by using the clock odd signal to obtain a to-be-processed command odd signal, and perform sampling processing on the intermediate command signal by using the clock even signal to obtain a to-be-processed command even signal; and
the second input circuit is configured to: receive an initial chip select signal and output an intermediate chip select signal, and
perform sampling processing and phase inversion processing on the intermediate chip select signal by using the clock odd signal to obtain a to-be-processed chip select odd signal, and perform sampling processing and phase inversion processing on the intermediate chip select signal by using the clock even signal to obtain a to-be-processed chip select even signal,
wherein the to-be-processed command odd signal and the to-be-processed command even signal constitute the to-be-processed command signal, and the to-be-processed chip select odd signal and the to-be-processed chip select even signal constitute the to-be-processed chip select signal.

5. The signal sampling circuit of claim 4, wherein the sampling and logic circuit comprises a first sampling circuit, a second sampling circuit, a first logic circuit, and a second logic circuit,
wherein the first sampling circuit is configured to perform first-stage sampling processing on the to-be-processed chip select even signal by using the clock odd signal to obtain a first chip select sampling odd signal, and perform second-stage sampling processing on the first chip select sampling odd signal by using the clock odd signal to obtain a second chip select sampling odd signal;
the second sampling circuit is configured to perform first-stage sampling processing on the to-be-processed chip select odd signal by using the clock even signal to obtain a first chip select sampling even signal, and perform second-stage sampling processing on the first chip select sampling even signal by using the clock even signal to obtain a second chip select sampling even signal;
the first logic circuit is configured to perform logic operation on the clock odd signal, the first chip select sampling odd signal and the second chip select sampling odd signal to obtain a chip select clock odd signal; and
the second logic circuit is configured to perform logic operation on the clock even signal, the first chip select sampling even signal and the second chip select sampling even signal to obtain a chip select clock even signal,
wherein the chip select clock even signal and the chip select clock odd signal constitute the chip select clock signal.

6. The signal sampling circuit of claim 5, wherein the first-stage sampling processing is rising edge sampling processing, and the second-stage sampling processing is falling edge sampling processing.

7. The signal sampling circuit of claim 6, wherein the first sampling circuit comprises a first flip-flop, a first NOT gate, and a second flip-flop,
wherein an input terminal of the first flip-flop is connected to the to-be-processed chip select even signal, a clock terminal of the first flip-flop is connected to the clock odd signal, an input terminal of the second flip-flop is connected to an output terminal of the first flip-flop, an input terminal of the first NOT gate is connected to the clock odd signal, an output terminal of the first NOT gate is connected to a clock terminal of the second flip-flop, and an output terminal of the second flip-flop is configured to output the second chip select sampling odd signal.

8. The signal sampling circuit of claim 7, wherein the second sampling circuit comprises a third flip-flop, a second NOT gate, and a fourth flip-flop,
wherein an input terminal of the third flip-flop is connected to the to-be-processed chip select odd signal, a clock terminal of the third flip-flop is connected to the clock even signal, an input terminal of the fourth flip-flop is connected to an output terminal of the third flip-flop, an input terminal of the second NOT gate is connected to the clock even signal, an output terminal of the second NOT gate is connected to a clock terminal of the fourth flip-flop, and an output terminal of the fourth flip-flop is configured to output the second chip select sampling even signal.

9. The signal sampling circuit of claim 7, wherein the first logic circuit comprises a first OR gate and a first AND gate,
wherein the first OR gate is configured to perform OR operation on the first chip select sampling odd signal and the second chip select sampling odd signal to obtain an intermediate odd signal; and
the first AND gate is configured to perform AND operation on the intermediate odd signal and the clock odd signal to obtain the chip select clock odd signal.

10. The signal sampling circuit of claim 7, wherein the second logic circuit comprises a second OR gate and a second AND gate,
wherein the second OR gate is configured to perform OR operation on the first chip select sampling even signal and the second chip select sampling even signal to obtain an intermediate even signal; and
the second AND gate is configured to perform AND operation on the intermediate even signal and the clock even signal to obtain the chip select clock even signal.

11. The signal sampling circuit of claim 7, wherein the decoding circuit comprises a first command decoding circuit, a second command decoding circuit, and a third OR gate,
- wherein the first command decoding circuit is configured to perform decoding and sampling processing on the to-be-processed command even signal according to the to-be-processed chip select even signal and the chip select clock odd signal to obtain a command even signal;
- the second command decoding circuit is configured to perform decoding and sampling processing on the to-be-processed command odd signal according to the to-be-processed chip select odd signal and the chip select clock even signal to obtain a command odd signal; and
- the third OR gate is configured to perform OR operation on the command even signal and the command odd signal to obtain the target command signal.

12. The signal sampling circuit of claim 11, wherein the first command decoding circuit comprises a first decoding circuit and a third sampling circuit,
- wherein the first decoding circuit is configured to perform decoding processing on the to-be-processed command even signal and the to-be-processed chip select even signal to obtain a command decoded even signal; and
- the third sampling circuit is configured to perform sampling processing on the command decoded even signal according to the chip select clock odd signal to obtain the command even signal.

13. The signal sampling circuit of claim 11, wherein the second command decoding circuit comprises a second decoding circuit and a fourth sampling circuit,
- wherein the second decoding circuit is configured to perform decoding processing on the to-be-processed command odd signal and the to-be-processed chip select odd signal to obtain a command decoded odd signal; and
- the fourth sampling circuit is configured to perform sampling processing on the command decoded odd signal according to the chip select clock even signal to obtain the command odd signal.

14. The signal sampling circuit of claim 5, wherein the initial chip select signal is a signal representing that a target chip is selected, and the initial chip select signal is an active-low pulse signal,
- wherein if the initial chip select signal is sampled as a low level at a rising edge of an even clock cycle, the to-be-processed chip select even signal is an active-high pulse signal; and
- a rising edge of a first pulse in the chip select clock odd signal is used for generating the rising edge of the target command signal, and a rising edge of a second pulse in the chip select clock odd signal is used for generating the falling edge of the target command signal.

15. The signal sampling circuit of claim 14, wherein:
- if the initial chip select signal is sampled as a low level at a rising edge of an odd clock cycle, the to-be-processed chip select odd signal is an active-high pulse signal; and
- a rising edge of a first pulse in the chip select clock even signal is used for generating the rising edge of the target command signal, and a rising edge of a second pulse in the chip select clock even signal is used for generating the falling edge of the target command signal.

16. A semiconductor memory, comprising a signal sampling circuit, wherein the signal sampling circuit comprising a signal input circuit, a clock receiving circuit, a sampling and logic circuit, and a decoding circuit,
- wherein the signal input circuit is configured to determine a to-be-processed command signal and a to-be-processed chip select signal;
- the clock receiving circuit is configured to receive an initial clock signal and perform frequency division processing on the initial clock signal to obtain a first clock signal, wherein a clock cycle of the initial clock signal is a preset clock cycle, and a clock cycle of the first clock signal is twice the length of the preset clock cycle;
- the sampling and logic circuit is configured to perform two-stage sampling processing and logic operation processing on the to-be-processed chip select signal according to the first clock signal to obtain a chip select clock signal, wherein the chip select clock signal comprises two pulses, and a width of each pulse is the preset clock cycle; and
- the decoding circuit is configured to receive the to-be-processed chip select signal and perform decoding processing and sampling processing on the to-be-processed command signal according to the to-be-processed chip select signal and the chip select clock signal to obtain a target command signal.

17. The semiconductor memory of claim 16, wherein the semiconductor memory is a Dynamic Random Access Memory (DRAM) chip.

18. The semiconductor memory of claim 16, wherein the first clock signal comprises a clock odd signal and a clock even signal,
- wherein the clock cycles of the clock odd signal and the clock even signal are both twice the length of the preset clock cycle, and a phase difference between the clock odd signal and even the clock signal is 180 degrees.

19. The semiconductor memory of claim 18, wherein the signal input circuit comprises a first input circuit and a second input circuit,
- wherein the first input circuit is configured to: receive an initial command signal and output an intermediate command signal, and
- perform sampling processing on the intermediate command signal by using the clock odd signal to obtain a to-be-processed command odd signal, and perform sampling processing on the intermediate command signal by using the clock even signal to obtain a to-be-processed command even signal; and
- the second input circuit is configured to: receive an initial chip select signal and output an intermediate chip select signal, and
- perform sampling processing and phase inversion processing on the intermediate chip select signal by using the clock odd signal to obtain a to-be-processed chip select odd signal, and perform sampling processing and phase inversion processing on the intermediate chip select signal by using the clock even signal to obtain a to-be-processed chip select even signal,
- wherein the to-be-processed command odd signal and the to-be-processed command even signal constitute the to-be-processed command signal, and the to-be-processed chip select odd signal and the to-be-processed chip select even signal constitute the to-be-processed chip select signal.

20. The semiconductor memory of claim 19, wherein the sampling and logic circuit comprises a first sampling circuit, a second sampling circuit, a first logic circuit, and a second logic circuit, wherein the first sampling circuit is configured to perform first-stage sampling processing on the to-be-processed chip select even signal by using the clock odd signal to obtain a first chip select sampling odd signal, and perform second-stage sampling processing on the first chip select sampling odd signal by using the clock odd signal to obtain a second chip select sampling odd signal;

the second sampling circuit is configured to perform first-stage sampling processing on the to-be-processed chip select odd signal by using the clock even signal to obtain a first chip select sampling even signal, and perform second-stage sampling processing on the first chip select sampling even signal by using the clock even signal to obtain a second chip select sampling even signal;

the first logic circuit is configured to perform logic operation on the clock odd signal, the first chip select sampling odd signal and the second chip select sampling odd signal to obtain a chip select clock odd signal; and the second logic circuit is configured to perform logic operation on the clock even signal, the first chip select sampling even signal and the second chip select sampling even signal to obtain a chip select clock even signal, wherein the chip select clock even signal and the chip select clock odd signal constitute the chip select clock signal.

\* \* \* \* \*